(12) United States Patent
Shintani et al.

(10) Patent No.: US 11,276,551 B2
(45) Date of Patent: Mar. 15, 2022

(54) INSPECTION DEVICE

(71) Applicant: Hitachi, Ltd., Tokyo (JP)

(72) Inventors: Atsuko Shintani, Tokyo (JP); Yasunari Sohda, Tokyo (JP); Noritsugu Takahashi, Tokyo (JP); Hikaru Koyama, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 16/823,658

(22) Filed: Mar. 19, 2020

(65) Prior Publication Data

US 2020/0365364 A1 Nov. 19, 2020

(30) Foreign Application Priority Data

May 17, 2019 (JP) .............................. JP2019-093640

(51) Int. Cl.
*H01J 37/22* (2006.01)
*H01J 37/28* (2006.01)
*H01J 37/244* (2006.01)
*H01J 37/10* (2006.01)
*H01J 37/30* (2006.01)
*H01J 37/21* (2006.01)

(52) U.S. Cl.
CPC ............ *H01J 37/222* (2013.01); *H01J 37/10* (2013.01); *H01J 37/21* (2013.01); *H01J 37/244* (2013.01); *H01J 37/28* (2013.01); *H01J 37/3005* (2013.01); *H01J 2237/1532* (2013.01); *H01J 2237/216* (2013.01); *H01J 2237/2448* (2013.01); *H01J 2237/2817* (2013.01); *H01J 2237/30427* (2013.01)

(58) Field of Classification Search
CPC .......... H01J 37/222; H01J 37/10; H01J 37/21; H01J 37/244; H01J 37/00; H01J 37/02; H01J 37/28; H01J 37/3005; H01J 37/023; H01J 37/15; H01J 37/153; H01J 37/22; H01J 37/26; H01J 37/261
USPC .......................................... 250/306, 307, 311
See application file for complete search history.

(56) References Cited

U.S. PATENT DOCUMENTS 9,437,394 B1 * 9/2016 Diemer ................. H01J 37/222
2003/0193026 A1 * 10/2003 Takagi ............... G01N 23/2251
250/311

(Continued)

FOREIGN PATENT DOCUMENTS

WO 2010082477 A1 7/2010

*Primary Examiner* — Jason L McCormack
(74) *Attorney, Agent, or Firm* — Miles & Stockbridge, P.C.

(57) ABSTRACT

An inspection device includes a charged particle optical system that includes a charged particle beam source emitting a charged particle beam and plural lenses focusing the charged particle beam on a sample, a detector that detects secondary charged particles emitted by an interaction of the charged particle beam and the sample, and a calculation unit that executes auto-focusing at a time a field of view of the charged particle optical system moves over plural inspection spots, the calculation unit irradiates the charged particle beam to the sample under an optical condition that is obtained by introducing astigmatism of a predetermined specification to an optical condition that is for observing a pattern by the charged particle optical system, and executes the auto-focusing using an image formed from a signal outputted by the detector in detecting the secondary charged particles.

15 Claims, 18 Drawing Sheets

(56) References Cited

U.S. PATENT DOCUMENTS

2011/0274341 A1 11/2011 Shirahata et al.
2015/0287201 A1* 10/2015 Shinoda .................. G06T 7/337
   382/144

* cited by examiner

FIG. 6
| | OBSERVED PATTERN A | OBSERVED PATTERN B |
|---|---|---|
| FOCUS POSITION SHIFTING:+ | (a) 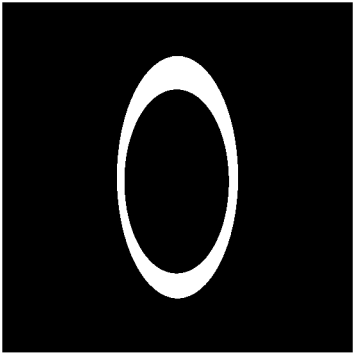 | (d) 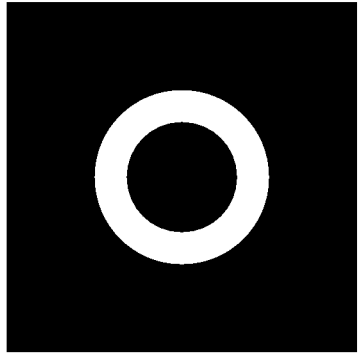 |
| BEST FOCUS POSITION | (b) 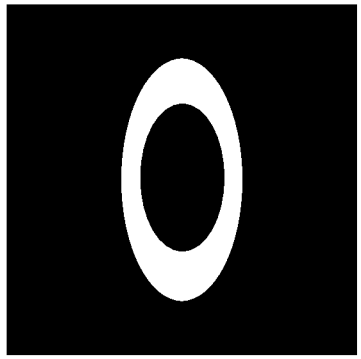 | (e) 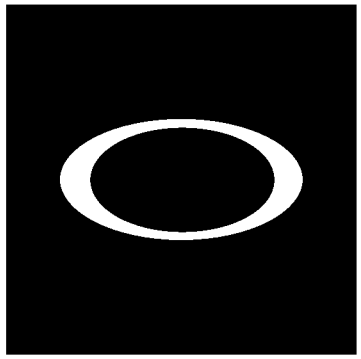 |
| FOCUS POSITION SHIFTING:− | (c) 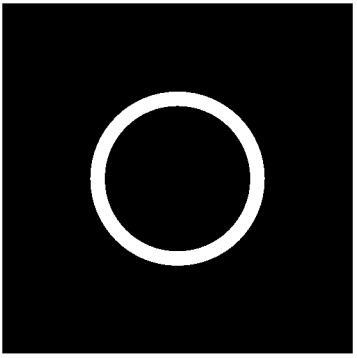 | (f) 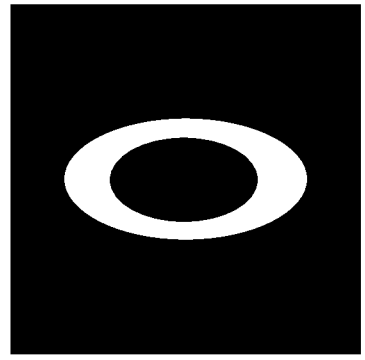 |
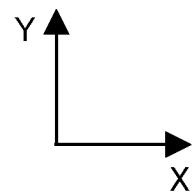

FIG. 13

| PICTORIAL FIGURE | IMAGING METHOD | DETERMINATION METHOD | | OPERATION METHOD |
|---|---|---|---|---|
| | | CALCULATION METHOD AND LEANING/ DETERMINING PICTORIAL FIGURE | OBJECT DATA (IMAGE/ CONTOUR) | |
| CLOSED CURVE | UTILIZE ABERRATION | INDEX | CONTOUR | MOVE TO BEST FOCUS (FIG. 5) |
| | | ARTIFICIAL INTELLIGENCE — SAME PICTORIAL FIGURE | | DETERMINE WHETHER WITHIN DEPTH OF FOCUS+MOVE TO BEST FOCUS (FIG. 10) |
| | | ARTIFICIAL INTELLIGENCE — DIFFERENT PICTORIAL FIGURE (SPLIT DETERMINATION DATA):METHOD A | IMAGE | DETERMINE WHETHER WITHIN DEPTH OF FOCUS+MOVE TO BEST FOCUS+ EXECUTE CONVENTIONAL AF (FIG. 11) |
| | | ARTIFICIAL INTELLIGENCE — DIFFERENT PICTORIAL FIGURE (SPLIT LEARNING DATA) :METHOD B | | DETERMINE FOCUS SEARCHING DIRECTION+EXECUTE CONVENTIONAL AF (FIG. 12) |

| PICTORIAL FIGURE | IMAGING METHOD | DETERMINATION METHOD | OPERATION METHOD |
|---|---|---|---|
| LINE PATTERN OF BOTH X, Y DIRECTIONS | UTILIZE ABERRATION | INDEX (PEAK WIDTH CORRESPONDING TO EDGE) | DETERMINE FOCUS SEARCHING DIRECTION+EXECUTE CONVENTIONAL AF |
| LINE PATTERN OF ONE DIRECTION | UTILIZE ABERRATION | ARTIFICIAL INTELLIGENCE (DETERMINES IMAGE) | |
| | UTILIZE DEFOCUSING | | |

INSPECTION DEVICE

CROSS-REFERENCE TO RELATED APPLICATION

This application claims priority to Japanese Patent Application No. 2019-093640 filed on May 17, 2019, the entire contents of which are incorporated by reference herein.

BACKGROUND OF THE INVENTION

The present invention relates to an inspection device using a charged particle beam image.

BACKGROUND ART

In the manufacturing process of a semiconductor device, there has occurred necessity of shortening also the time taken for inspection and dimension measurement (will be hereinafter collectively referred to as an inspection) in order to reduce the total cost. Therefore, improvement of throughput has been required with respect also to a Scanning Electron Microscope (SEM) that observes a fine pattern in the middle of the manufacturing step.

Although the fine pattern is imaged with high resolution in an inspection step by a SEM, in order to achieve high resolution, there is required a function of automatically focusing the object pattern precisely (will be hereinafter referred to as auto-focusing). In general, during the auto-focusing process, imaging of a focus position z of an electron microscope on the basis of an observation object while being changed by a predetermined step $\Delta z$ is repeated. Normally, the focus position z is changed by every $\Delta z$ adjusting the current made to flow through the optical system of the incident beam and voltage while the position of the observation object remains to be fixed. Respective images are analyzed, an index $\alpha$ corresponding to the sharpness (resolution) is calculated from the images, a focus position z where the sharpest image has been acquired is made an optimum focus position (will be hereinafter referred to as z_best), and the focus is moved to the position.

In order to obtain the optimum focus position z_best, it is required to repeat the imaging/analyzing cycles to find out variation of the index $\alpha$ of the sharpness with respect to the focus position z as FIG. 1. Also, here, the image is determined to be sharper as the index $\alpha$ is larger. Z that gives the maximum value of $\alpha$ is the optimum focus position z_best.

z_best may be determined after obtaining the sharpness with respect to all images acquired in a certain range of z, or imaging may be stopped when the value of the sharpness a changes from increase to decrease while executing imaging and index calculation while changing z and acquiring the data points of FIG. 1 one by one, however, in order to determine the optimum focus position z_best, it is necessary to obtain at least three points in total of a point where a becomes maximum on the graph and points on both sides thereof. However, it is not known whether the focus position z_0 in the initial state is in the plus direction or in the minus direction with respect to the optimum focus position z_best. As a result, in order to obtain z_best, it is necessary to acquire the image data in a certain degree of the range of z, and it is essential to repeat imaging/analyzing in order to complete auto-focusing. As a result, the time of one second or more is taken in average for auto-focusing per one position.

Therefore, in the mass production process of a semiconductor for executing inspection/measurement at a number of spots, it is required to shorten the auto-focusing time. In international publication WO 2010/082477, there is proposed a method of decimating beam scanning of image acquisition in auto-focusing (or in correcting astigmatism) and using an image with less amount of information. Thus, the imaging time in auto-focusing can be shortened. However, since the number of times of imaging/analyzing cannot be reduced, the inspection time reduction effect is limited.

SUMMARY OF THE INVENTION

The focus position z_best achieving the optimum namely the highest sharpness (resolution) or being in its state will be hereinafter referred to as best focus, and being shifted from the optimum focus position or being in the shifted state will be hereinafter referred to as defocus. In order to reduce the time taken for auto-focusing, reduction of the number of times of imaging/analyzing is effective. Therefore, it is ideal if the relation between the focus position z_0 at the time of imaging and the best focus position z_best is known from one sheet of the image. At least, positive or negative of (z_best-z_0) has only to be known. The reason is that the direction of searching the best focus position is limited, and the time taken for auto-focusing can be expected to become half compared to a case of searching the best focus position while changing the focus position in both plus and minus directions with respect to the focus position z_0 of the time of imaging.

However, the above is not easy. The reason is that the shape of the object pattern is not known. Assume that the object pattern is a small projected pattern called a dot pattern. The diameter of the projected pattern is approximately 50 nm, and the bight is approximately 70 nm. When the observed pattern is in a circular column shape having a generally perpendicular side wall ((a) in FIG. 2), the pattern contour on the image obtained by best focusing becomes sharp. A schematic drawing where the image is binarized is illustrated in (b) in FIG. 2. Although the image obtained by a SEM is intrinsically a gray scale image reflecting the signal amount, for the sake of simplification, a portion with high signal intensity is expressed by white, and a portion with low signal intensity is expressed by black. On the other hand, when the same observed pattern ((a) in FIG. 2) is imaged under the defocusing condition, an image like (c) in FIG. 2 is obtained. That is to say, although the blur amount (the width of the white belt-like region for example) of the signal reflects shifting of the focus, the defocus amount (z_best-z_0) cannot be estimated from the blur amount of the image.

First, from the appearance of blurring of the signal, it is not known whether the present focus position z_0 is shifted to the positive direction with respect to the best focus position z_best, that means the distance between the focus position and the stage is too short, or to the negative direction. In both cases of shifting, the signal profile shape becomes a similar shape.

Second, the blur amount reflects the effect of the shape of the object pattern. With respect to a pattern formed targeting the circular column shape, the side wall thereof possibly comes to have a tapered shape ((a) in FIG. 3) depending on the process condition. In this case, an image like (b) in FIG. 3 is obtained in imaging by best focusing, and an image like (c) in FIG. 3 is obtained under the defocusing condition. Thus, the best focus image ((b) in FIG. 3) with respect to the observed pattern having the side wall of the tapered shape ((a) in FIG. 3) and the image ((c) in FIG. 2) having been blurred by defocusing of the observed pattern ((a) in FIG. 2) whose contour is intrinsically sharp cannot be discriminated from each other.

In addition, when the best focus position is to be estimated from the imaging result of one time, measures for the case where reliability of the estimated best focus position is low are required. In a case of the prior method for example, such measures are taken that the step amount Δz for changing the focus position is made smaller, or that the range for changing the focus position is made wide, and so on. Also in a case where the best focus position is to be estimated from one sheet of the image, when the required accuracy is high or when required accuracy cannot be secured due to a problem of the image quality and the like, such measures are required that erroneous information is not to be outputted, or that higher accuracy is to be secured.

To recap the above, in order to shorten the inspection time by an electron microscope, to shorten the time taken for auto-focusing is effective. Therefore, it is enabled to estimate the defocus amount (relative shift amount from the best focus position) or at least the direction of defocusing (the sign of (z_best-z_0)) hopefully from one sheet or an extremely small number of sheets of the image. The estimation should be such one that is not affected by blurring of the contour caused by the shape of the object pattern. Also, in order to achieve the accuracy of a same as or higher than the degree of the prior art, a procedure of assuring reliability of estimation and further improving the accuracy is required.

The inspection device that is an embodiment of the present invention is an inspection device that observes patterns formed on a sample at plural inspection spots, the inspection device including a charged particle optical system that includes a charged particle beam source emitting a charged particle beam and plural lenses focusing the charged particle beam on the sample, a detector that detects secondary charged particles emitted by an interaction of the charged particle beam and the sample, and a calculation unit that executes auto-focusing at a time a field of view of the charged particle optical system moves over the plural inspection spots, in which the calculation unit irradiates the charged particle beam to the sample under an optical condition that is obtained by introducing astigmatism of a predetermined specification to an optical condition that is for observing the pattern by the charged particle optical system, and executes the auto-focusing using an image formed from a signal outputted by the detector in detecting the secondary charged particles.

The inspection device that is another embodiment of the present invention is an inspection device that observes patterns formed on a sample at plural inspection spots, the inspection device including a charged particle optical system that includes a charged particle beam source emitting a charged particle beam and plural lenses focusing the charged particle beam on the sample, a detector that detects secondary charged particles emitted by an interaction of the charged particle beam and the sample, and a calculation unit that executes auto-focusing at a time a field of view of the charged particle optical system moves over the plural inspection spots, in which, in executing the auto-focusing, the calculation unit irradiates the charged particle beam to the sample under an optical condition that is for observing the pattern by the charged particle optical system, acquires a first image and a second image, the first image being formed from a signal outputted by the detector in detecting the secondary charged particles, a focus point of the charged particle beam being shifted from that of the time when the first image is acquired in the second image, the first image and the second image including a line pattern image or a space pattern image extending in one direction, and determines a direction for eliminating a position shift between a focus position of the charged particle beam of the time when the first image is acquired and a best focus position based on a magnitude relation between a width of the line pattern image or the space pattern image in the first image and a width of the line pattern image or the space pattern image in the second image, and a shift amount between a focus position of the charged particle beam of the time when the first image is acquired and a focus position of the charged particle beam of the time when the second image is acquired is made within a depth of focus of the inspection device.

According to the present invention, by reducing the number of times of imaging for estimating the best focus position, the time taken for auto-focusing can be reduced. As a result, it is allowed to provide a charged particle beam device having a high throughput in inspection of a pattern forming step and an inspection device using the same.

Problems, configurations, and effects other than those described above will be clarified by explanation of embodiments hereinafter described.

BRIEF DESCRIPTION OF THE DRAWINGS

FIG. 6 illustrates schematic drawings of an image acquired introducing astigmatism;

FIG. 13 is a table that summarizes auto-focusing methods using a pattern image having a closed curve shape;

DETAILED DESCRIPTION OF THE PREFERRED EMBODIMENTS

In order to grasp the relation between the focus position z_0 at the time of imaging and the best focus position z_best from one sheet of the image, firstly, imaging for auto-focusing is executed using a beam being purposely superposed with aberration that is controllable independently from the focus position, whose behavior is known quantitatively, that has a characteristic of distorting the image to a constant direction according to defocusing, and that allows the distortion to become asymmetric with respect to the best focus position z_best (the first feature). As such aberration, astigmatism can be used for example.

Secondly, a method of detecting distortion and extracting a defocus amount from the image imaged by the first method is constructed (the second feature).

Thirdly, an inspection device is provided which improves reliability of the defocus amount estimated from the image, establishes an operation flow capable of achieving high accuracy according to the necessity, and incorporates the operation flow (the third feature). Each of the above will be hereinafter explained in detail.

Figure 4:
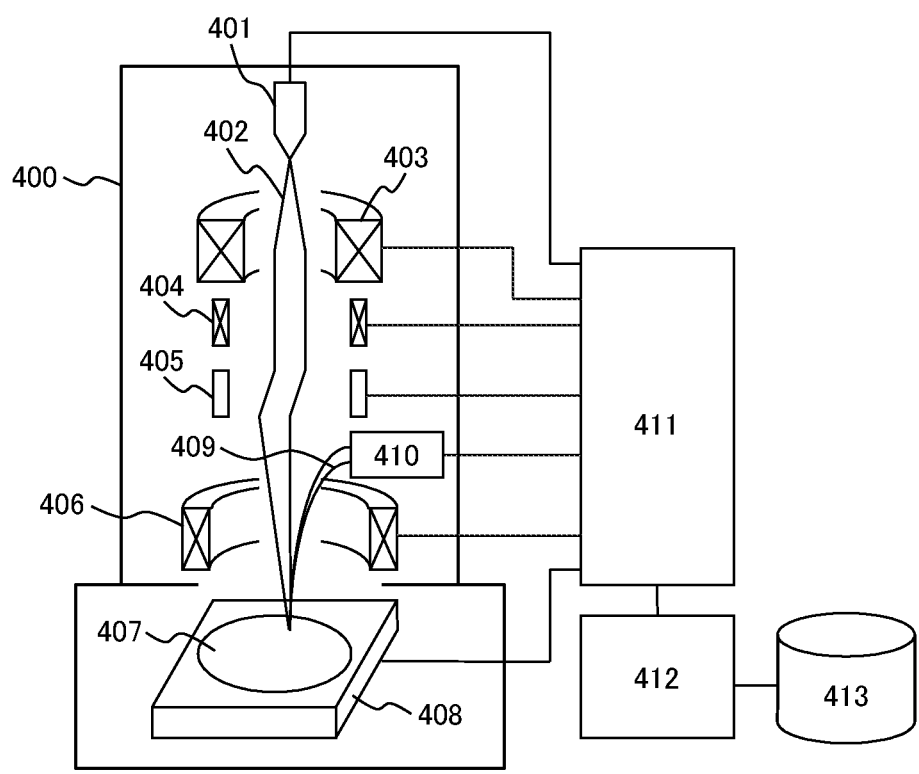
FIG. 4 is a schematic configuration drawing of a scanning electron microscope.

First, detailed explanation will be made on imaging by a beam where aberration for auto-focusing is superposed which is the first feature. In FIG. 4, a schematic configuration drawing of a scanning electron microscope (SEM) is illustrated as an example of a charged particle beam device used for an inspection device. A case 400 includes a column and a sample chamber, and is kept in a high vacuum state, an electronic optical system and a detection system being stored in the column, a stage 408 being stored in the sample chamber, a sample 407 (a wafer here) being mounted on the stage 408. As main configurations, the electronic optical system includes an electron gun 401 that emits an electron beam (primary electrons) 402, electron lenses (a focusing lens 403, an object lens 406) for focusing the electron beam 402 on the sample 407, an astigmatism corrector 404 executing astigmatism correction, and a deflector 405 that bidimensionally scans the electron beam 402 on the sample 407. The detection system includes a detector 410 that detects secondary electrons 409 emitted by an interaction of the electron beam 402 and the sample 407. Configuration elements configuring the electronic optical system and the detection system are controlled by a control unit 411. A calculation unit (computer) 412 controls the electronic optical system and the detection system through the control unit 411, and forms an image that is based on a signal from the detector 410. Also, to the calculation unit 412, a storage device 413 is connected, the storage device 413 storing control information and image information.

When such SEM is to be used as an inspection device in a manufacturing process of a semiconductor device, first, adjustment of the electronic optical system (primary optical system) is to be completed using a wafer for adjustment. In concrete terms, an optical axis is adjusted so that an incident beam passes through the electron lens center part of the electronic optical system, the current value or the voltage value of the current flowing through the electronic optical system is adjusted so as to minimize various kinds of aberration (including astigmatism), and set values whose adjustment has been completed are stored in a temporary storage region within the calculation unit 412 of the device. Even when the focus position has been aligned by the wafer for adjustment, in inspecting mass production wafers practically, appropriate focus position differs according to each of plural the inspection spots on the mass production wafer because of a slight difference in the thickness for each of the mass production wafers or difference in the height of the sample surface even in a same wafer, and it is required to execute auto-focusing for each of the inspection spots in order to execute inspection with high resolution.

Figure 5:
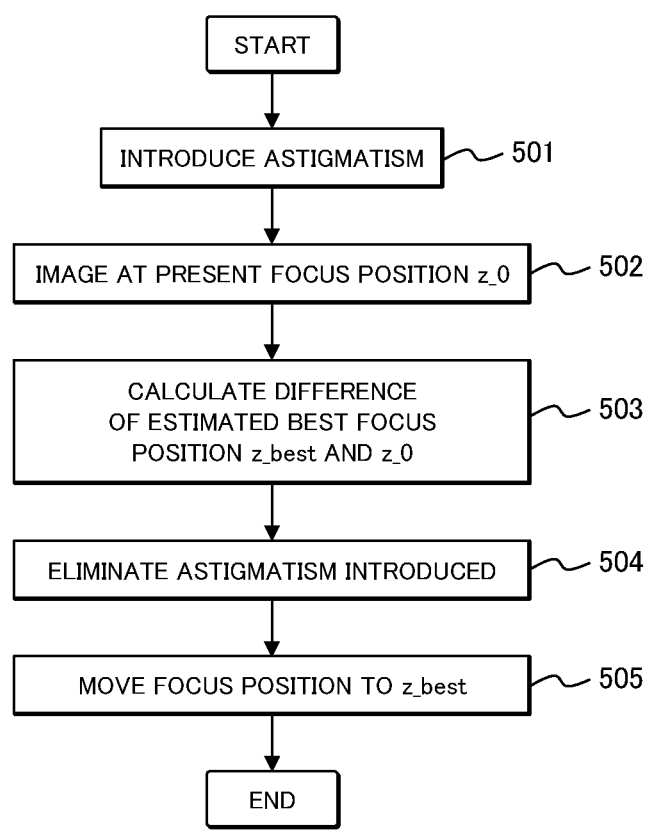
FIG. 5 is a basic flow of auto-focusing.

A basic flow of auto-focusing is illustrated in FIG. 5. After an operator selects a project pattern, all of the respective steps are executed automatically by the calculation unit 412. First, a parameter value determining the performance of the electron optical system is shifted from an adjustment value so that only predetermined astigmatism is generated (step 501), the adjustment value having been stored in the temporary storage region within the calculation unit 412. In contrast to that astigmatism of the electron beam 402 is minimized namely is made 0 in the state of the adjustment value, a predetermined amount of astigmatism is generated purposely. This can be executed by that the amount of the current made to flow through the astigmatism corrector 404 is made a current amount that is obtained by superposing a current amount for generating desired astigmatism on the current amount of the adjustment value. Also, since the relation between the defocus amount and the deformation direction and the deformation amount of the pattern image is dependent on the hardware characteristics of the electron microscope and the condition of the astigmatism having been added, the specification of the astigmatism introduced is to be fixed.

Next, a pattern for auto-focusing is imaged at an optional focus position z_0 by the electron beam 402 to which predetermined astigmatism has been introduced (step 502). Next, the obtained image is analyzed, the optimum focus position z_best is estimated, and the relative distance with the estimated optimum focus position z_best (z_best-z_0) is calculated (step 503). The detail of this step 503 will be described below. Then, superposition of the current to the astigmatism corrector 404 executed in step 501 is stopped, and the astigmatism introduced in the step 501 is eliminated (step 504). Next, the focus position is moved by the difference obtained in step 503, and the focus position is made z_best (step 505).

For the object pattern for executing auto-focusing, a pattern for auto-focusing arranged in the mass production wafer is used. However, when the pattern for auto-focusing is not located at an appropriate position, a pattern for inspection or another pattern located in the vicinity of the pattern for inspection may be used. Also, in the basic flow of FIG. 5, the order of step 504 can be reversed with respect to step 503 or step 505, and step 504 can be executed in parallel with step 503 or step 505. By execution in parallel, the time can be shortened further.

An example of a pattern image acquired introducing astigmatism is illustrated in FIG. 6. The present drawing is also a schematic drawing having been binarized. The left column is one imaged with respect to the observed pattern A ((a) in FIG. 2), and the right column is one imaged with respect to the observed pattern B ((a) in FIG. 3). Also, the middle stage is one imaged at the best focus position, the upper stage is one imaged in a state the focus position is shifted to the positive (+) direction, and the lower stage is one imaged in a state the focus position is shifted to the negative (−) direction. In concrete terms, imaging is executed while being shifted by 500 nm respectively from the base point of the best focus position. In each drawing, the X-direction is the beam scanning direction of the SEM, and the Y-direction is a direction orthogonal to the X-direction.

Thus, the pattern image acquired introducing astigmatism is not dependent on the pattern shape, and the direction of distorting responding the direction of the focus position shift is common. Also, when the side wall of the circular column inclines (the observed pattern B), although the width of the belt-like region looking white of the image differs, the degree of distortion (the shift amount of the contour of the pattern from a true circle) is the same as that of the case of the perpendicular side wall. Therefore, even when the shape of the observed pattern may be deteriorated, the defocus amount can be determined correctly. Also, the degree of distortion will be described in detail in explanation of the second feature.

Next, explanation will be made on the second feature namely a method of detecting distortion of the shape from the image and extracting the defocus amount. There are roughly three kinds of methods of estimating the focus position shift amount from the focus position shift image including astigmatism. The first one is a method of indexing distortion of the pattern shape coming out in a SEM image, the second one is a method of directly determining a SEM image using an artificial intelligence, and the third one is a method of forming a contour drawing where the contour of the pattern shape coming out in a SEM image extracted and allowing the artificial intelligence to determine the contour drawing.

A method of indexing distortion of the pattern shape of the first one (the first method) will be explained. Explanation will be made exemplifying a SEM image of the observed pattern A illustrated in (a) to (c) in FIG. 6. The procedure described hereinafter is an example.

First, the barycenter of the brightness distribution of the pixels is obtained, and is made the point of origin (also, respective SEM images illustrated in FIG. 6 are already in a state of placing the barycenter of the brightness distribution of the pixels at the center). Directions of deformation by astigmatism and defocusing are expressed by vectors V1, V2. The vector V1 and the vector V2 are orthogonal to each other. In this example, the vector V1 is made to be in the direction of the X-axis, and the vector V2 is made to be in the direction of the Y-axis. Next, the contour of the pattern is extracted (it is needless to mention that extraction is not executed with respect to the binarized image but is executed with respect to the gray scale image having been acquired). For example, brightness distribution of the image is measured radially from the point of origin and is made a signal profile, an edge point of the pattern is defined on the signal profile, and one connecting the edge points on a number of the signal profiles can be made the contour. Alternately, it is also possible to employ such method that a point where reduction of the brightness is sharpest in tracking the brightness from the point of origin to the outer side is made the edge point of the pattern on the signal profile, and so on. Any known method can be used for extraction of the contour line, and the present invention is not limited by the method.

The contour line obtained by imaging a pattern of a dot, a hole, and the like becomes a shape that can be approximated by an ellipse (inclusive of a true circle). Therefore, when the major axis and the minor axis are obtained with the barycenter described above being made the center of the ellipse, they become the diameters of the direction of V1, V2 respectively (or reverse thereof depending the defocusing direction). Accordingly, the diameters are obtained in the V1, V2 directions, each of them is made a, b, and a/b can be made the index $\xi$ of distortion. In order to simplify the procedure, the specification of the astigmatism can be set so that the directions of deforming by astigmatism and defocusing (the vectors V1, V2) become the X-axis direction and the Y-axis directions respectively (FIG. 6 illustrates such example).

Based on theoretical calculation or the result of the analysis of the data acquired beforehand, the relation between the index $\xi$ (=a/b) and the defocus amount is to be obtained. Thus, the defocus amount at the time of imaging can be estimated from the index $\xi$.

Also, the procedure described above is of a case where the shape of the object pattern as observed from the top is a true circle. When the object pattern is an ellipse or another anisotropic pictorial figure, the barycenter is determined first from the brightness distribution, the edges of the pattern are obtained in the directions of the vectors V1, V2, and the ratio thereof is made the index $\xi$. The relation between the index $\xi$ and the defocus amount is to be obtained beforehand.

Further, it is also possible to calculate the diameters in the directions V1, V2 which are the distortion directions from the brightness distribution of respective pixels of the image without extracting the contour line. For example, it is possible to use a second-order momentum obtained by multiplying the square of the distance of each pixel from the barycenter by the brightness which is deemed to be the weight.

Thus, with respect to the method of using the index, there is a case of requiring to change the definition of the index according to the shape of the pattern for auto-focusing. It is required for the operator to prepare the relation between the index $\xi$ and the defocus amount every time the pattern for auto-focusing changes, or otherwise, the operator himself or herself may be required to define a new index. Methods for avoiding such complication are the methods using the artificial intelligence shown as the second and third methods. For example, the operator allows a convolutional neural network (will be hereinafter abbreviated as CNN) having been prepared to learn the pattern to which the auto-focus function is scheduled to be applied after introducing the astigmatism of a constant specification with an image group obtained by imaging with a defocus amount having been known beforehand and the defocus amount thereof being linked to each other. Thus, it is enabled to estimate the defocus amount immediately from the image in the inspection device. The operator can respond the change of the pattern for auto-focusing by executing learning at the timing the pattern to which the auto-focus function is scheduled to apply changes and working out an optimum CNN. Although it is required to execute learning every time the pattern changes, since acquisition and learning of the image data can be executed automatically, there is an advantage of capable of executing acquisition and learning of the image data within a shorter time compared to the case of using the index which is the first method and without involving the manpower.

Figure 1:
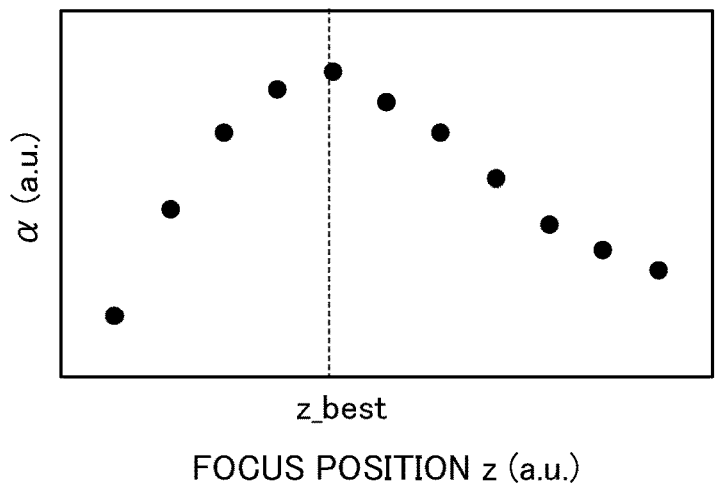
FIG. 1 is a schematic drawing that illustrates an example of focus point dependency of a sharpness index.
Figure 2:
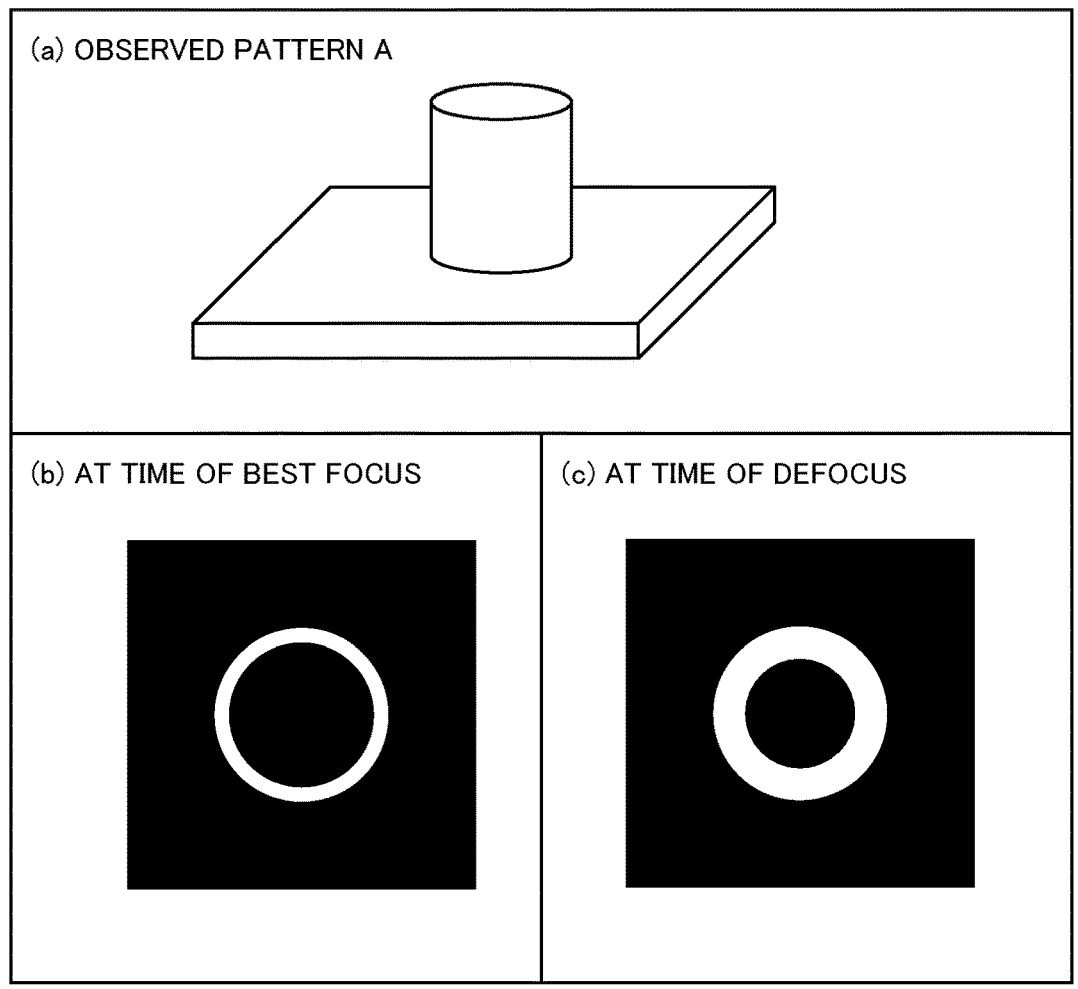
FIG. 2 illustrates examples of a schematic drawing that illustrates a pattern and its top view image.
Figure 3:
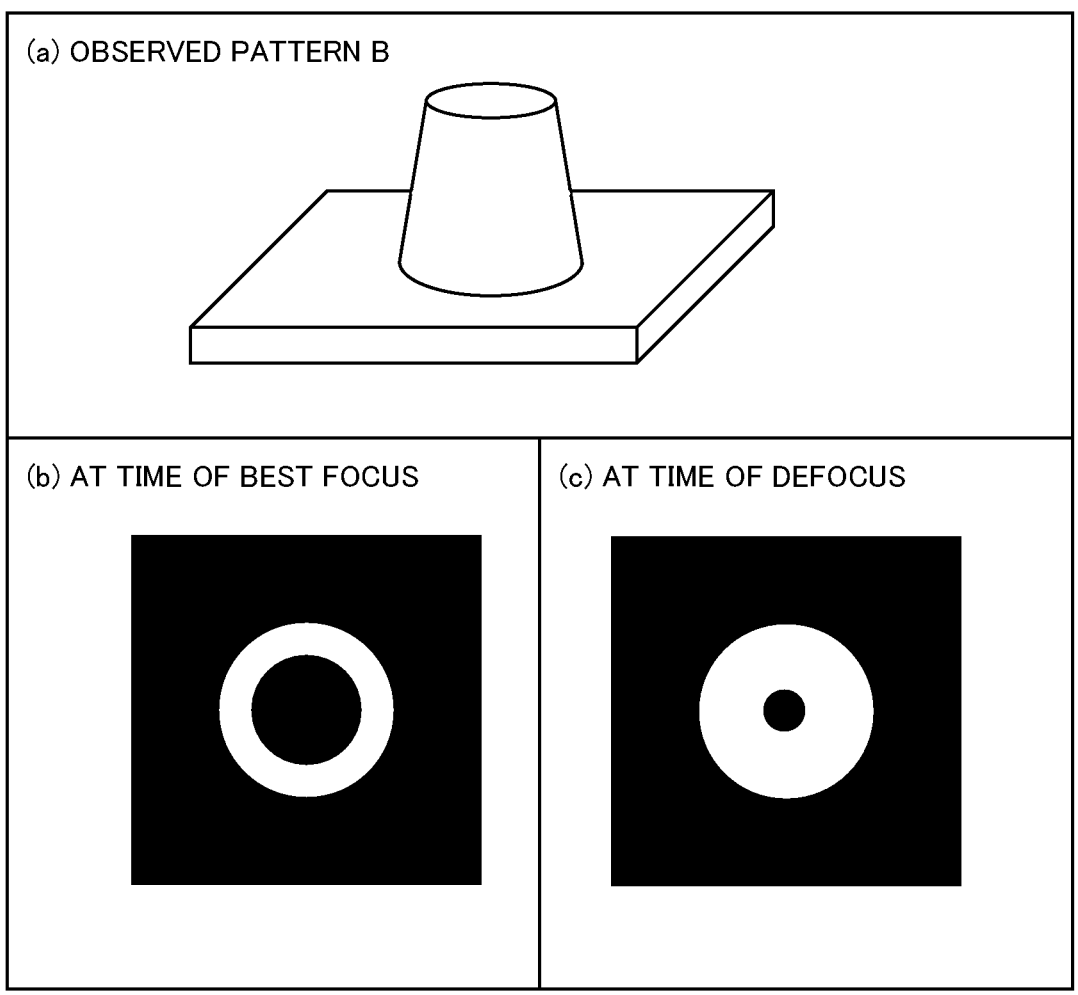
FIG. 3 illustrates other examples of a schematic drawing that illustrates a pattern and its top view image.

It is also possible to respond determination of several patterns by one CNN having been learnt instead of repeating learning of the CNN every time the pattern changes. Two methods are possible for it. They are the method A and the method B. In both methods, one whose contour becomes a closed curve in the top-down image such as a hole or a dot pattern is basically used. The reason of doing so is to utilize a characteristic that the direction of distortion of the pattern of the image changes according to negative/positive of defocusing when astigmatism exists. Here, for the sake of simplification, a dot pattern having a circular column shape exemplified in FIGS. 2 and 3 is to be used.

Figure 7:
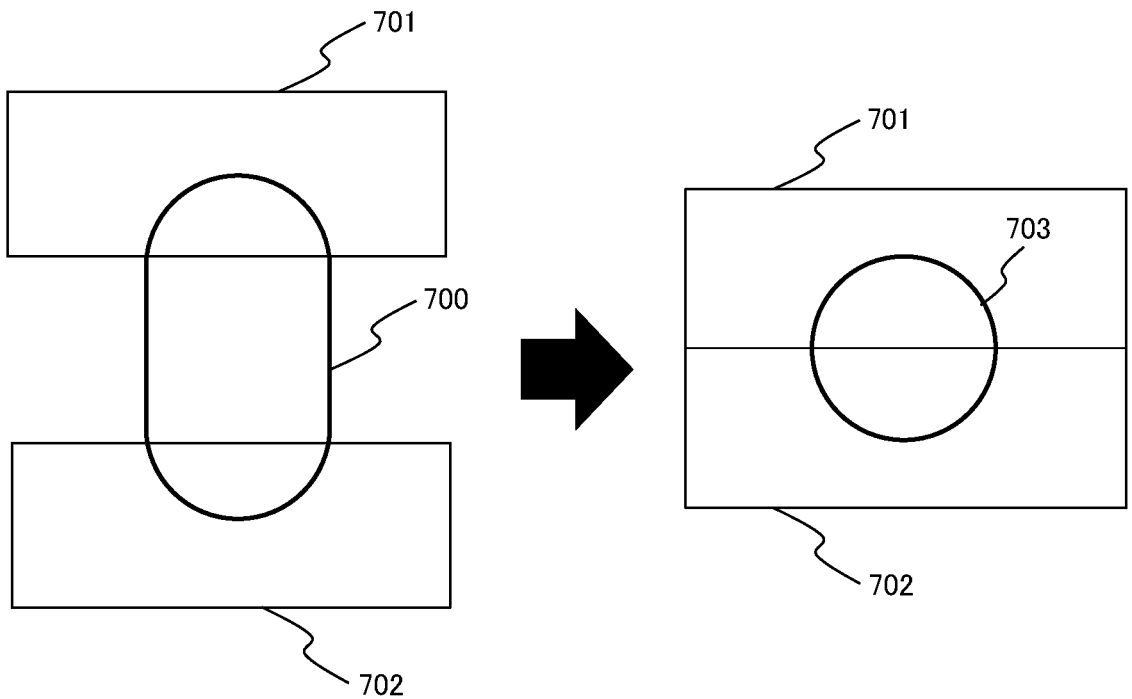
FIG. 7 is a drawing that explains a method for artificially forming a pattern image.

According to the method A, the CNN is made to execute learning using an ordinary dot pattern. On the other hand, when the CNN having learnt is made to presume an image whose focus position (z) is not known, parts capable of configuring an image equivalent to a dot pattern image on which learning has been executed are cut out from the image whose focus position (z) is not known, these parts are connected to each other, and a synthesized pattern image equivalent to the dot pattern is worked out artificially. This example is illustrated in FIG. 7. From a top-view image 700 of the pattern (only the contour line is illustrated), regions 701, 702 that possibly exist in the dot pattern used in learning are taken out and are connected to each other, thereby a pattern image 703 is worked out, and the CNN having learnt can be made to execute presumption.

Figure 8:
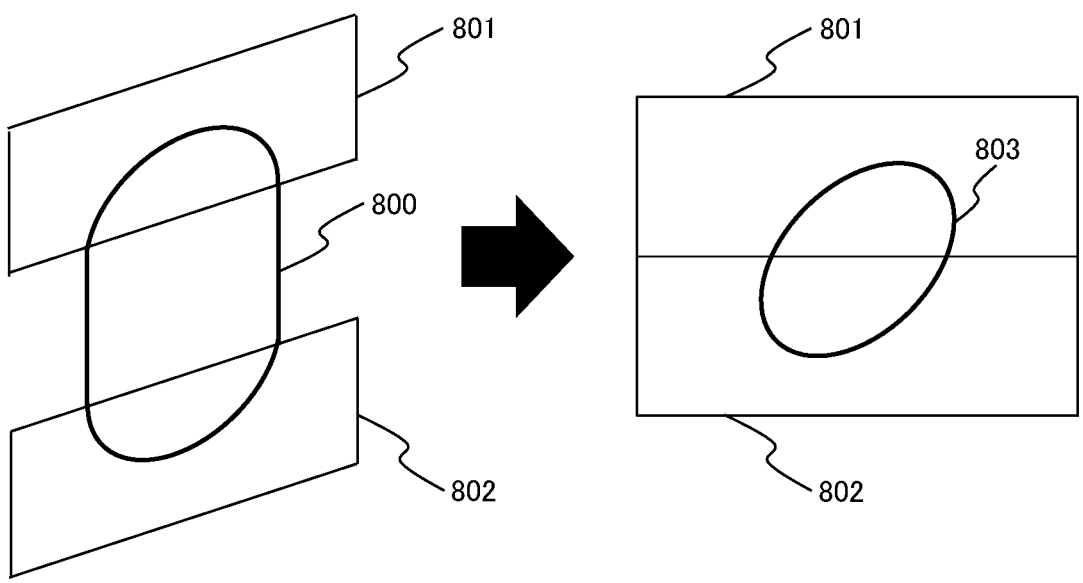
FIG. 8 is a drawing that explains a method for artificially forming a pattern image.

Also, it is necessary to pay attention to that the pattern imaged under the defocusing condition added with astigmatism possibly becomes like a top-view image 800 illustrated in FIG. 8. In this case, watching that a portion of the rectangular shape deforms into a parallelogram and a true circle deforms into an ellipse, regions 801, 802 are taken out and are connected to each other, thereby a pattern image 803 is worked out, and the CNN having learnt can be made to execute presumption. In order to avoid this complication, astigmatism is to be adjusted so that the vectors V1, V2 expressing the direction of deformation become the X-axis direction and the Y-axis direction of the image.

Figure 9:
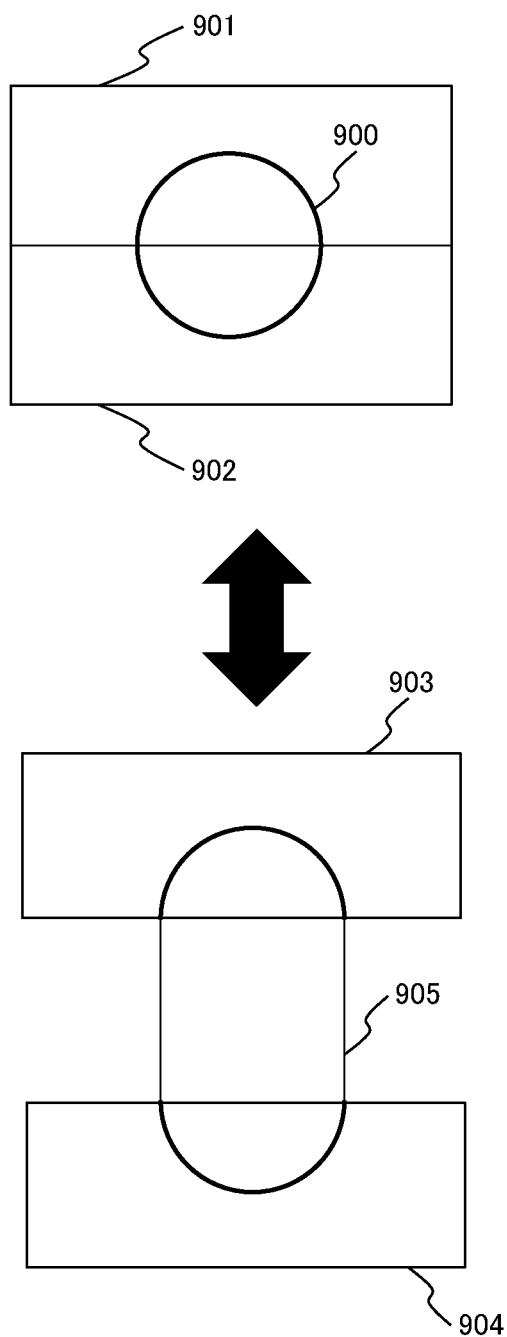
FIG. 9 is a drawing that explains a method for splitting a pattern image and forming an image for learning.

According to the method B, contrary to the method A, patterns (split image) obtained by splitting a dot or a hole pattern are used in the learning process of the CNN. As illustrated in FIG. 9, a top-view image 900 is divided by regions 901, 902, the top-view image 900 being obtained by defocusing the dot or the hole pattern with astigmatism being introduced at the time of imaging. It is to be noted that this expresses splitting of the image for learning. The defocus amount is linked to the images 901, 902 that have been split and have become independent image data. The CNN is made to execute learning using this data set.

When the image of the pattern used for auto-focusing is assumed to be a pattern image 905, partial regions 903, 904 having the same character as that of the regions 901, 902 are cut out from the image 905, and the artificial intelligence can be made to analyze each of them to calculate the defocus amount. Although the defocusing estimation results are obtained by same number of pieces with the number of splits, they can be averaged. Although the contour of the dot or the hole pattern becomes an ellipse by defocusing, since how the ellipse is to be split into two depends on the character of astigmatism having been introduced, it is necessary to study the character of the astigmatism beforehand. Also, this method is the same as a method for identification of the regions 701, 702 of the method A.

With respect to the method B also, similarly to the method A, it is better to set astigmatism so that the direction of deformation becomes the X-axis direction and the Y-axis direction. Further, although an example of splitting the top-view image 900 of a true circle into two is shown here, general versatility is improved when an image of a true circle is split into four. However, the calculation time becomes long.

Next, a method of using an artificial intelligence after extracting the contour line which is the third method will be explained. With respect to a method of directly learning and determining a pattern image, although the process time can be shortened by a portion that there is no image processing step such as obtaining a contour line from an image, there is a possibility that a difference in the pattern shape namely a difference in the width of such the belt-like white region as seen in image examples of FIG. 6 for example becomes a noise at the time of determination. Therefore, the contour of the pattern is taken out once from the image instead of the pattern image itself, and the artificial intelligence is used for the pattern contour image. Both of the method A and the method B explained as the second method can be applied.

Although the inspection time may possibly increase for extraction of the contour line, in a case of the examples of FIG. 6, even if the width of the belt-like region may differ because of inclination of the side wall of the pattern, when defocusing is the same, the contour line obtained becomes an ellipse, circularity and eccentricity of the contour line do not differ much, and the error can be made small compared to a case of directly learning and determining the pattern image.

Also, the pattern image used utilizes a pattern having a closed curve shape since the defocus amount is estimated from the state of deformation to two directions (V1, V2). With respect to the pattern having a closed curve shape, although it is preferable to use a pattern for auto-focusing, when there is no pattern for auto-focusing at an appropriate position, an end of a line pattern or a space pattern can be used. When there is no end of a line pattern or a space pattern, the vicinity of the edge of a line pattern or a space pattern can be used, and this case will be described below.

Next, explanation will be made on the third feature namely a method of determining reliability of the result and further executing auto-focus adjustment according to the result to improve the accuracy.

In the flow of FIG. 5, the difference of the focus position z_0 at the time of imaging and the best focus position z_best is estimated. Reliability of this estimated value can be described by an error. According to the first method (distortion of the pattern shape is expressed by the index), for example, since the pattern shape contour extracted from the pattern image is deemed to be an ellipse and circularity and eccentricity are calculated, it is possible to fit the extracted contour by an ellipse and the fitting residual or the residual sum of squares can be made the reliability index.

According to the second and third methods (an artificial intelligence is used), the error of determination (estimation) by the artificial intelligence can be made a reliability index. When the artificial intelligence is of a type of executing regression, an error of regression is outputted along with the result as the reliability index. When the artificial intelligence is of a type of executing determination, following thinking is possible. Assume that the candidates of the defocus amount (z_best-z_0) are set for example from −1,000 nm to +1,000 nm at 100 nm intervals. The determination result of the defocus amount obtained by inputting a certain image to the artificial intelligence is given by probability. For example, assume that the probability of being −300 nm is 0.2, the probability of being −200 nm is 0.6, the probability of being −100 nm is 0.1, and the probability of being 0 nm is 0.1. The defocus amount and the reliability index can be defined as follows for example. In one method, the defocus amount is defined to be the weighed mean of the result. When the mean value is calculated with the probability described above being made the weight, the result becomes −190 nm, and the deviation around this mean value becomes 83.1 nm. Therefore, the defocus amount is made −190 nm and the reliability index is made 83 nm. It is possible to use dispersion instead of deviation. In another method, the defocus amount is defined to be a value whose probability is highest among the candidates. In this case, the defocus amount becomes −200 nm. The reliability index is the deviation around this value, and becomes 83.7 nm.

Next, a method for operating the auto-focus function will be explained. First, when confirmation of accuracy of auto-focusing is not required (a case where it has been known from experience that required accuracy can be secured beforehand by the flow illustrated in FIG. 5 for example, and so on), an image for inspection can be acquired after executing the basic flow illustrated in FIG. 5.

Figure 10:
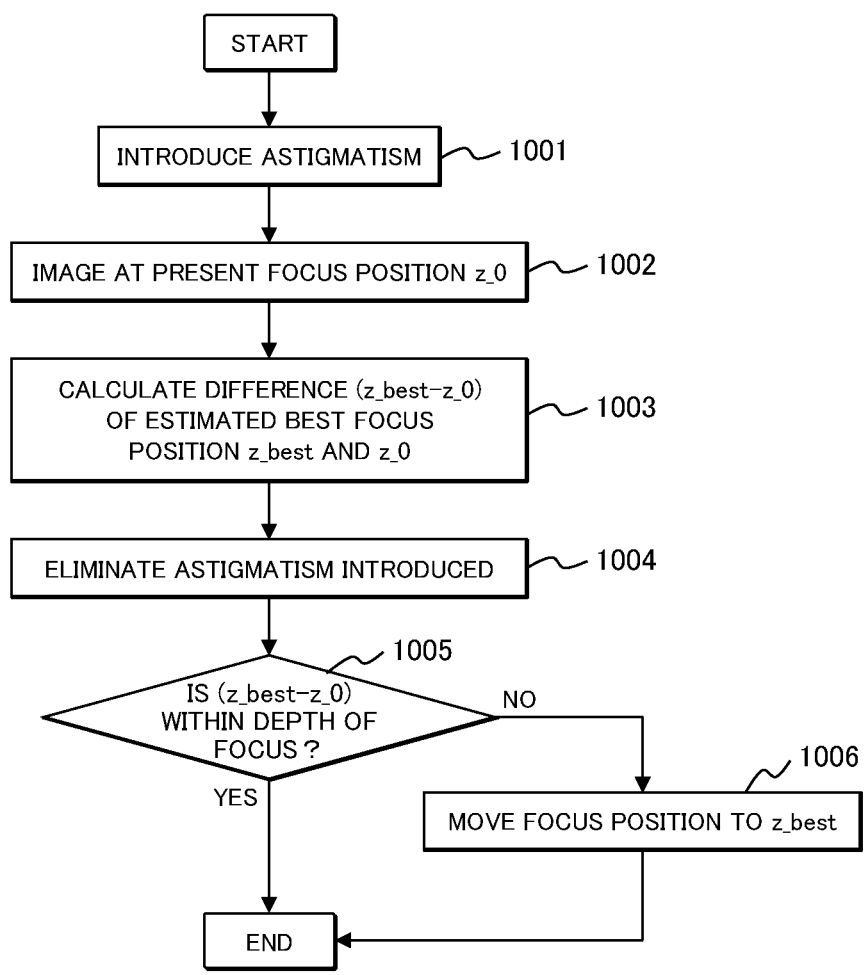
FIG. 10 is a flow of auto-focusing.

Second, when confirmation of accuracy of auto-focusing is not required similarly to the first case and it is desirous to shorten the time as much as possible in addition, it is better to execute the flow illustrated in FIG. 10. Steps 1001 to 1004 of this flow are the same with steps 501 to 504 of the flow of FIG. 5. In step 1005, whether (z_best-z_0) is within the range of the depth of focus of the system is determined, and the focus is not to be moved when (z_best-z_0) is within the range of the depth of focus. There is a case where the time incurred for adjustment of the optical system thereby becomes unnecessary, and the throughput increases by that portion. Also, similarly to the case of FIG. 5, step 1004 may be executed after step 1005 or step 1006, and may also be executed in parallel.

Figure 11:
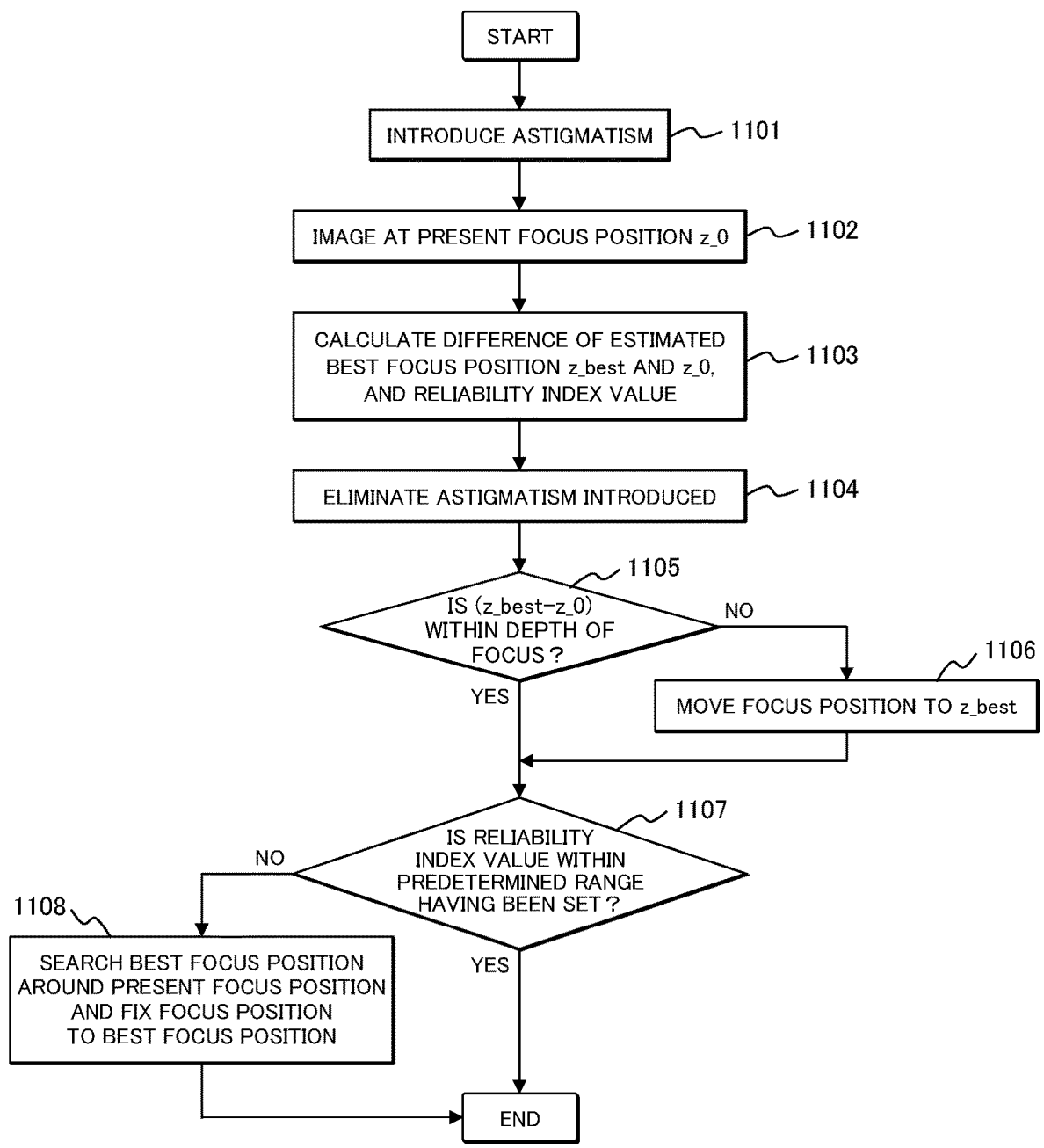
FIG. 11 is a flow of auto-focusing.

Third, when it is desirous to improve accuracy of auto-focusing, it is better to execute the flow illustrated in FIG. 11. Steps 1101 to 1106 are the same as steps 1001 to 1006 of the flow of FIG. 10 excepting that the reliability index is calculated in step 1103. Similarly to the case of the second, whether (z_best-z_0) is within the range of the depth of focus of the system is determined, and the focus is adjusted according to the necessity (steps 1105 to 1106). Thereafter, in step 1107, whether the reliability index is within a predetermined range is determined. When the reliability index exceeds the predetermined range, searching of the auto-focus position is executed (step 1108). The auto-focus function in step 1108 is to execute imaging while simply changing the focus position z little by little to obtain the focus position z that maximizes the sharpness. Although the obtaining method is similar to that of the prior art, unlike the conventional focus searching in a wide range, since the searching is on the base point of a position near the best focus position, the time can be shortened compared to conventional auto-focusing.

In the flow of FIG. 11 also, although each step is expressed so as to be executed in series, step 1104 can be executed in parallel with other steps. In a similar manner, steps of calculation (determination) of steps 1105 and 1107 can be executed in parallel, and the time can be shortened. Also, the order of these steps can be reversed.

Here, if the reliability index is defined by the deviation of the estimated defocus amount as described above, it is better to make the predetermined range in step 1107 to be the depth of focus. The reason of doing so is that, since the fact that the reliability index is within the predetermined range means that the error of the best focus position that is achieved as a result of estimation is less than the depth of focus, it can be expected to obtain a sufficiently sharp image.

Figure 12:
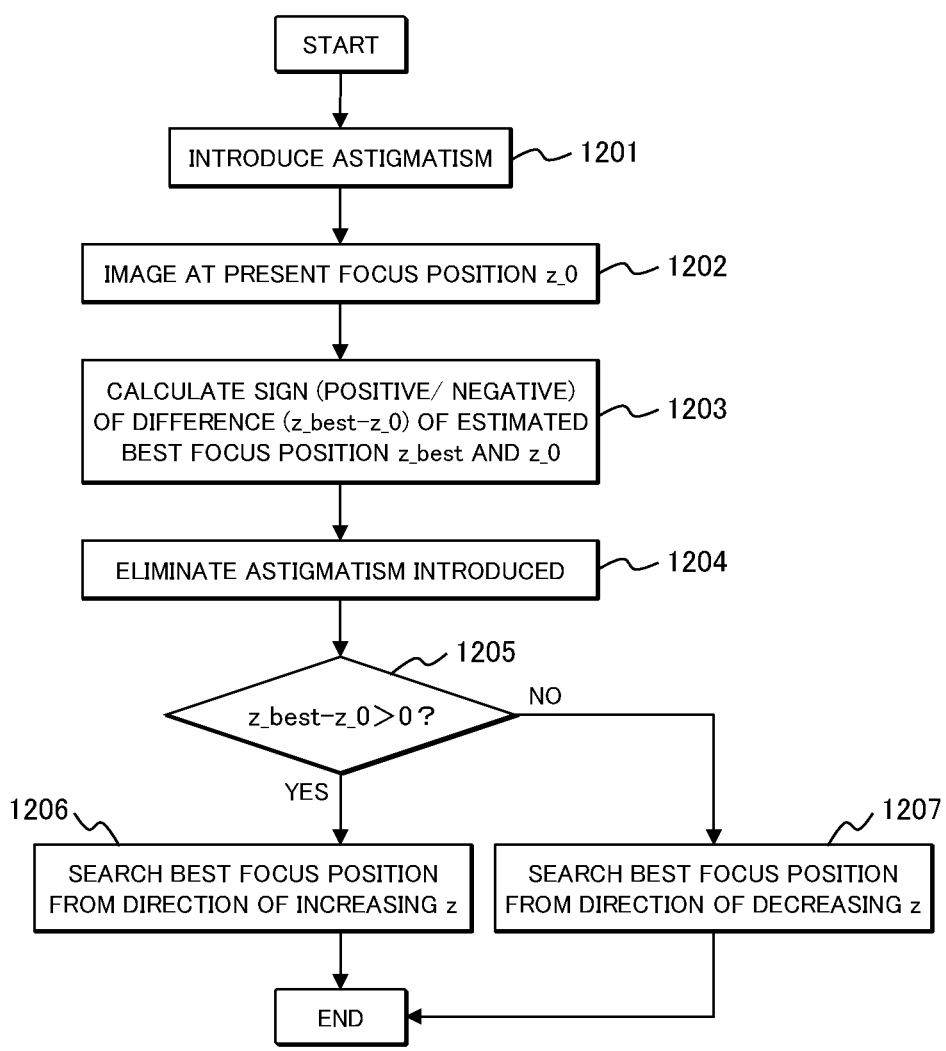
FIG. 12 is a flow of auto-focusing.

Fourthly, when an image with high noise level is handled and when an artificial intelligence with less learning amount is used namely when it is presumed beforehand that reliability of determination is low, it is better not to obtain the moving amount of the focus but to obtain the moving direction only from one sheet of the image. In this case, there are two choices of moving the focus position z to the plus direction, and moving the focus position z to the minus direction. For example, it is better to execute a flow illustrated in FIG. 12. In step 1205, it is estimated that the best focus position is to the direction of increasing z from the present state when the calculated value is positive and to the direction of decreasing z from the present state when the calculated value is negative. The process proceeds to step 1206, 1207 respectively, the cycle of executing imaging while shifting z from the initial value z_0 to the direction according to positive/negative of (Z_best-z_0) and finding the sharpness from the image having been obtained is to be repeated, and the focus point z that maximizes the sharpness is to be searched.

When a tendency of deterioration of sharpness is seen in the first time or in the initial several times in steps 1206, 1207, the best focus position is to be searched to the opposite direction. In many cases, the best focus position is found in the direction following the determination executed in step 1205, and therefore the time taken for searching can be halved compared to a case of searching the best focus position without estimating the direction. Since the time taken for step 1201 to step 1205 is one order or more shorter than the time required for step 1206 or step 1207, the time taken for auto-focusing in total can be shortened to approximately half compared to the past. Even when determination by (Z_best-z_0) is wrong and focus searching is executed to the opposite direction in the beginning, the time taken longer than conventional auto-focusing is the time taken for step 1201 to step 1205 which become the overhead, and is 10% or less as described above. Since auto-focusing is required to be executed for plural spots, the time shortening effect can be secured in total.

The above is auto-focusing using a pattern image having a closed curve shape in the present embodiment, and its method is summarized in FIG. 13. According to the table illustrated in FIG. 13, 32 kinds of the methods in total are possible by combination of four kinds of the calculation methods, two kinds of the object data, and four kinds of the operation methods. The operator executes auto-focusing selecting appropriate combination. For example, when the artificial intelligence is used and the learning pattern and the determination object pattern are different from each other, it is better to take the method A when the learning time can be shortened and long determination time is allowable, and it is better to take the method B in the opposite case.

When there is not the closed curve shape nor the curved shape of the end of the line and the space at an easily observable position on the sample, auto-focusing is to be executed using the vicinity of the edge of the line pattern or the space pattern. How the defocus amount is to be determined from the observation image of a linear edge of the line pattern or the space pattern will be explained. Although a case of the line pattern will be hereinafter explained, a case of the space pattern is similar as well.

In this case, since the distortion cannot be grasped correctly as done for the closed curve shape, in order to execute quantitative determination, it is required to make the original shape of the sample constant, the shape being whether the side wall is formed perpendicularly and so on for example. However, since observation is actually executed in order to inspect the shape of the sample, it is hard to make the original shape of the sample constant, and an error cannot be avoided in estimating the defocus amount. However, since it is considered to be capable of determining from which direction searching of the best focus position is to be started, auto-focusing is to be executed in accordance with the flow of FIG. 12.

Figure 14:
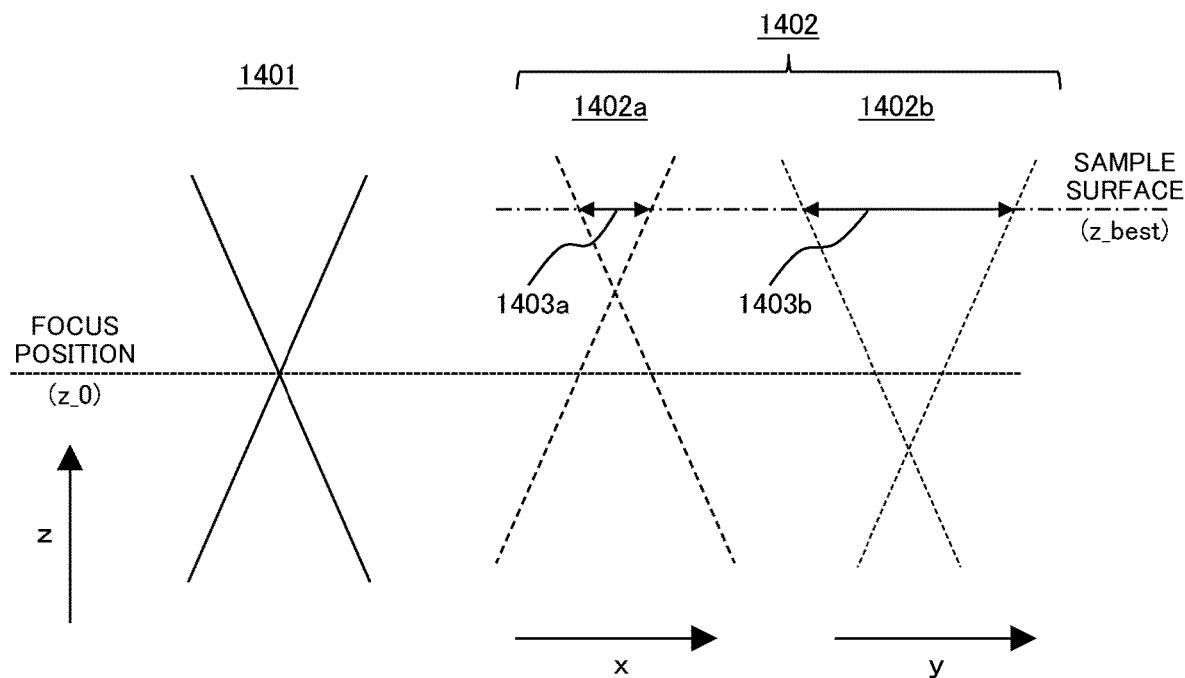
FIG. 14 is a drawing that illustrates broadening of a beam around the focus position.

The first case is a case where line patterns parallel to the X-direction (being coincident with the scanning direction of the incident beam) and the Y-direction (the direction orthogonal to the X-direction) on the observation sample exist respectively. The specification of astigmatism to be introduced is made such that the vectors V1, V2 that are the deformation direction of the pattern image are coincident with the X-direction and the Y-direction respectively. A state of spread of the beam around the focus position is illustrated in FIG. 14. A beam 1401 is of a case without astigmatism, and there is no difference between the state of spread of the beam as viewed in the X-direction and that as viewed in the Y-direction. If there exists the surface of the observation sample at a point minimizing spread of the beam, high resolution is secured (namely the sample surface position is z_best). A beam obtained by adding astigmatism to the beam 1401 where a point minimizing spread of the beam exists at the position z_0 is a beam 1402, and a beam 1402a expresses spread of the beam in the XZ plane, and a beam 1402b expresses spread of the beam in the YZ plane. Thus, by adding the astigmatism, the point minimizing spread of the beam exists on opposite side across the focus position z_0 between spread in the XZ plane and spread in the YZ plane for example. Also, at the focus position z_0, the spreading amount of the beam is same in the X-direction and the Y-direction.

Therefore, when the sample surface position exists at a positive position for example, an edge of a line extending in the Y-direction comes to blur only a little in the X-direction, and an edge of a line extending in the X-direction comes to blur largely in the Y-direction (the width of an arrow line 1403 corresponds to the spreading amount of the beam). When the sample surface position exists at a negative position, the way of blurring becomes opposite. Thus, based on the magnitude relation of blurring of the edge of the line extending in the Y-direction and the line extending in the X-direction, it is possible to estimate whether the focus position at the time of imaging exists above the best focus position or below the best focus position.

Figure 15:
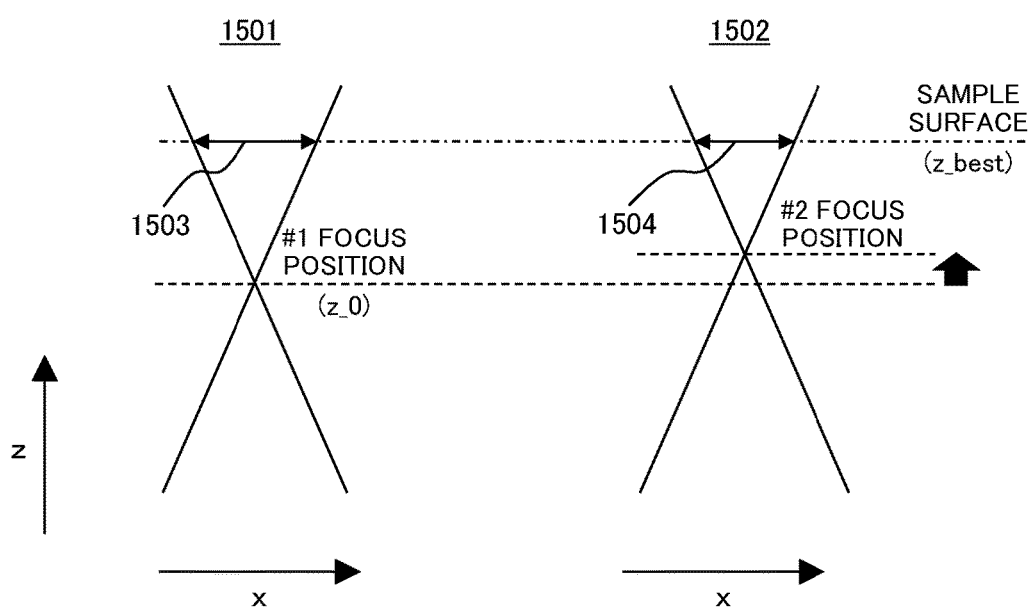
FIG. 15 is a drawing that illustrates broadening of a beam around the focus position.

The second case is a case where only a line pattern extending in one direction exists on the observation sample. In this case, two alternatives of the method I and the method II are possible. The pattern used is made a line pattern extending in the Y-direction. In FIG. 15, a beam 1501 expresses spread of the beam in imaging of the first time. Although a beam 1502 expresses spread of the beam in imaging of the second time, the focus position is shifted by introducing astigmatism. In this case, when spread of the beam in imaging of the first time is the width of an arrow line 1503 and spread of the beam in imaging of the second time is the width of an arrow line 1504, blurring of the edge region of the second time should be slightly smaller. When the focus position in imaging exists on the opposite side with respect to the best focus position (the sample surface position), the result becomes opposite. From this tendency, to which direction the best focus position should be searched can be known. The method II is different in the way of shifting of the focus position. In the method II, for example, imaging of the second time is executed slightly lowering the relative position of the sample (lifting the focus position of the beam when the sample stage is fixed in the Z-direction).

In both cases of the method I and the method II, when shifting of the focus position in imaging of the first time and in imaging of the second time is too large, the focus position possibly moves beyond the best focus position (the sample surface position). In this case, correct determination cannot be executed. Therefore, the focus amount to be moved is made the depth of focus or less. When the focus amount to be moved is the depth of focus or less, even when the focus position moves beyond the best focus position, the image is not deteriorated.

Figures 16, 17:
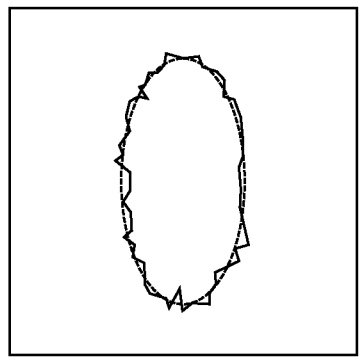
FIG. 16 is a table that summarizes auto-focusing methods using a line (space) pattern.
FIG. 17 is an example of a contour line extracted from an observed image and an ellipse that approximates the same.

The above is auto-focusing using a linear line pattern or a space pattern in the present embodiment, and its methods are summarized in FIG. 16. According to the table illustrated in FIG. 16, six kinds of the methods in total are possible by combination of three kinds of the imaging methods and two kinds of the determination methods. However, when an image of a line pattern in one direction is to be used, since defocusing appears in blurring (width) of the signal peak in the vicinity of the edge, the index is convenient and can secure the accuracy compared to a case of using an artificial intelligence, therefore it is considered that there is no choice of the artificial intelligence as the determination method in the case of the line pattern in one direction, and the determination method comes to be selected from four kinds of the methods in a practical way.

In both cases of using a closed curve and using a line pattern, it is better to output an image to a monitor, the image being imaged introducing an aberration at a spot of the pattern for auto-focusing. Also, it is better to store the image in a storage region. Further, it is better to execute imaging at a stage of completion of auto-focusing, and to display these images on a monitor. Also, it is preferable to store these images in a storage region. These are for the purpose of confirming that the auto-focus function is operated correctly.

First Embodiment

According to a first embodiment, the inspection time is shortened by determining the focusing condition of the image for inspection and executing inspection according to the defocus amount estimated from one sheet of the image. Also, the effect shown here is obtained by simulation.

According to the method used in the first embodiment, in the table of FIG. 13, the calculation method is the artificial intelligence, the learning/determining pictorial figure is a same pictorial figure, the object datum is the image, and the operation method is combination of "determination within depth of focus+movement to best focus". The CNN is used in estimating the defocus amount from the image.

First, explanation will be given with respect to a procedure for constructing a CNN that executes defocusing estimation by learning. The user observed a hole pattern 40 nm in diameter formed in a silicon wafer using a SEM, and acquired an image. At the time of imaging, after eliminating various kinds of aberration, imaging is executed while changing the focus position by a conventional method, and the best focus position is obtained as a position where sharpness of the image became the highest. Next, astigmatism is introduced, the defocus value is changed from −5 μm to +5 μm at 0.2 μm interval with the best focus position being made a reference (zero), and thereby 100 sheets of the images are imaged at respective focus positions. Also, the astigmatism introduced is made to have such specification that the direction of distortion by the astigmatism became the XY-axis direction. Since the defocus value is in 51 stages, 5,100 sheets of the images are obtained in total. For example, images like (a) in FIG. 6 are acquired in the defocus value of +, images like (b) in FIG. 6 are acquired in the defocus value 0, and images like (c) in FIG. 6 are acquired in the defocus value of −. The learning data pieces are configured by both of these images and the defocus values of the respective images.

Next, from 5,100 pieces of the learning data, 3,000 pieces are selected at random, and the CNN having been prepared is allowed to learn the same. When a test is executed using remaining 2,100 pieces of the learning data, the correct answer rate became 98%, and therefore this CNN is employed. Here, "correct answer" means a case where the defocus value estimated from the image is within the range of (the defocus value in actual imaging)±0.05 µm.

The CNN having completed learning and the test is copied to the calculation unit of the SEM, and is used for inspection. The inspection is to measure a finished dimension (actual diameter) of a hole pattern having the designed value of the diameter of 40 nm formed in a silicon wafer by etching. In the present inspection, aligning of the focus is also executed by the pattern for inspection.

In the inspection, after the wafer is placed in the SEM, various kinds of aberration are evaluated, parameter values of the optical system minimizing the aberration are set, and those values are stored as a file in a storage region within the calculation unit of the SEM. Thereafter, sequences described below are repeated. The sequences are, first, referring to the data of the coordinate information of the target pattern and the order of the inspection spots having been registered beforehand, moving to the vicinity of the target pattern, executing imaging with a low observation magnification, precisely matching the position upon finding the target pattern within the field of view, and executing auto-focusing with a high magnification. With respect to auto-focusing, the flow of FIG. 10 is automatically executed by the calculation unit of the SEM. Auto-focusing is executed, the image for inspection is acquired at the best focus position, and the diameter of the hole pattern is obtained from this image. The same procedure is repeatedly executed moving to the next spot according to the information of the inspection spot having been registered beforehand.

Chips for executing the inspection are 21 pieces of the chips on the wafer, and there are 9 inspection positions within each chip. Therefore, the inspection comes to be executed at 189 positions per one sheet of the silicon wafer. It is necessary to execute auto-focusing at every inspection spot, it took 2.0 seconds for auto-focusing in the past, and failure of the auto-focusing occurred by approximately 10%. When it is failed in auto-focusing, the operator is required to check the inspection result and to repeat the inspection, and therefore it takes approximately 7 to 9 minutes in excess per one sheet of the wafer. In this regard, the time taken for auto-focusing is shortened to approximately 0.2 second in the first embodiment. Also, it is expected that the failure of auto-focusing is eliminated, and therefore it becomes possible to shorten the time taken for the inspection by approximately 15 minutes per sheet of the wafer.

Second Embodiment

According to a second embodiment, the inspection time is shortened by executing the inspection determining the focusing condition of the image for inspection according to the defocus amount estimated from one sheet of the image. The effect shown here is also secured by simulation.

According to the method used in the second embodiment, in the table of FIG. 13, the calculation method is the index, the object datum is the contour, and the operation method is combination of "determination within depth of focus+movement to best focus+execution of conventional AF". According to the second embodiment, a contour line becoming a closed curve is extracted from the same dot pattern image as that of the first embodiment, the focus position is corrected based on a defocus amount estimated by indexing the shape of the contour line, and the inspection is executed. The inspection object is a dot pattern with 40 nm of the diameter formed in the silicon wafer. With respect to the image having been imaged introducing astigmatism, the deformation amount $\xi$ is calculated as described below. Similarly to the first embodiment, the astigmatism introduced is made to have such specification that the direction of distortion by the astigmatism became the XY-axis direction. First, the barycenter and the contour of the pattern are extracted. The contour having been extracted is illustrated in FIG. 17. An ellipse of the broken line is an ellipse approximating the contour line having been extracted, and the barycenter is placed at the center of the image. The contour is approximated by an ellipse, the diameter of the Y-direction of the ellipse (an intersection point of X=0, Y>0 and the ellipse) is made a, the diameter of the X-direction of the ellipse (an intersection point of Y=0, X>0 and the ellipse) is made b, and a/b is made the index $\xi$. At the same time, the fitting residual in approximating the contour line by an ellipse (the result obtained by dividing the sum of squares of the distance between the edge point configuring the contour line and the ellipse by the number of pieces of the edge points) is defined as β and is made the reliability index of determination.

Figure 18:
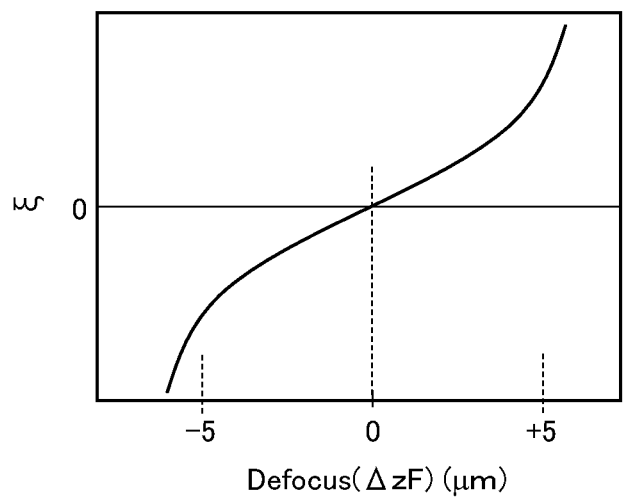
FIG. 18 is an example of a graph that expresses a relation between a defocus amount and an index $\xi$.

From the specification of the astigmatism having been set beforehand, the relation of the defocus amount and the index $\xi$ is known to become as illustrated in FIG. 18. This relation between the defocus amount and the index $\xi$ is stored in the storage region of the SEM as a table linking the value of the index $\xi$ and the defocus value.

The procedure of the inspection is the same as that of the first embodiment. However, with respect to auto-focusing, the flow of FIG. 11 is automatically executed by the calculation unit of the SEM. In step 1103, the defocus amount ΔzF corresponding to the value of the index $\xi$ is obtained using the obtained relation between the index $\xi$ and the defocus amount having been stored in the storage region (refer to FIG. 18). One obtained by reversing the sign of the defocus amount ΔzF is (z_best-z_0). Also, in step 1107, reliability is determined based on a reliability index β. This allowable limit is to be estimated beforehand from sensitivity of the inspection, the condition of the noise, and so on.

In a case of proceeding to step 1108, even though it is required to take the time similar to that of the conventional method (the method of repeating imaging changing the focus position), with respect to a case where the result becomes Yes in determination of step 1107, the auto-focusing time can be shortened by approximately 1.5 seconds. Since the case of proceeding to step 1108 is estimated to be approximately 10% of the total, the auto-focusing time can be substantially shortened as a whole.

Third Embodiment

According to a third embodiment, the inspection time is shortened by executing the inspection determining the focusing condition of the image for inspection according to the defocus amount estimated from one sheet of the image.

According to the method used in the third embodiment, in the table of FIG. 13, the calculation method is the artificial intelligence, the learning/determining pictorial figure is a different pictorial figure, splitting is executed for the learning data (the method B), the object datum is the contour, and the operation method is combination of "determination within depth of focus+movement to best focus+execution of conventional AF". The CNN is used in estimating the defocus amount from the image.

First, explanation will be given with respect to a procedure for constructing a CNN that executes defocusing estimation by learning. With respect to the same silicon wafer as that of the first embodiment, 5,100 sheets of the images are obtained in total for the defocus value of 51 stages by a similar procedure. Then the contour line is extracted from these images. This procedure is similar to that of the second embodiment.

Figure 19:
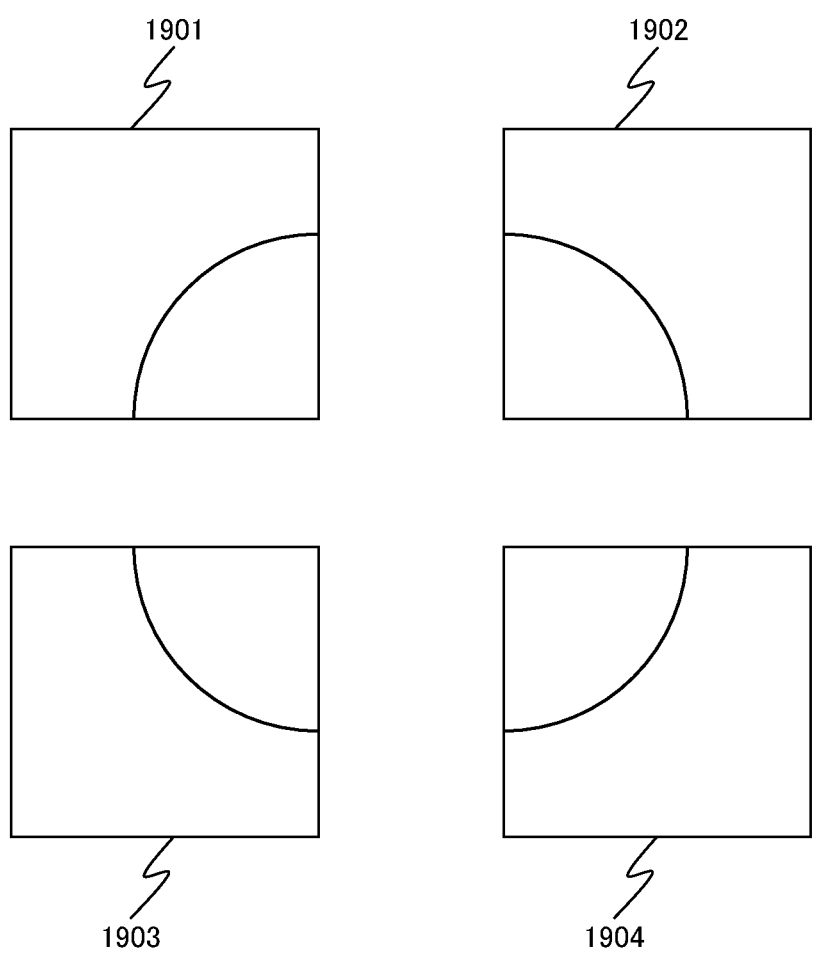
FIG. 19 is an example of a split image that is obtained by splitting an image for learning into four and taking out a contour line.

Next, the contour line is shown graphically, the graph is made to an image, and an image split into the first, second, third, and fourth quadrants is worked out. For example, from an image of the hole pattern, four line works (images) 1901 to 1904 as illustrated in FIG. 19 are obtained eventually. These data pieces are combined with the defocus amount of the time of imaging them and become four learning data pieces. Since 5,100 sheets of the images have been obtained for learning, 20,400 pieces in total of the learning data are generated.

Next, from 20,400 pieces of the learning data combining the image and the defocus value in imaging, 12,000 pieces are selected at random, and the CNN having been prepared is allowed to learn the same. When a test is executed using remaining 8,400 pieces of the data, the correct answer rate became 98%, and therefore this CNN is employed. "Correct answer" here is also the same as that of the first embodiment. The CNN having completed learning and the test is copied to the calculation unit of the SEM, and is used for inspection.

Figure 20:
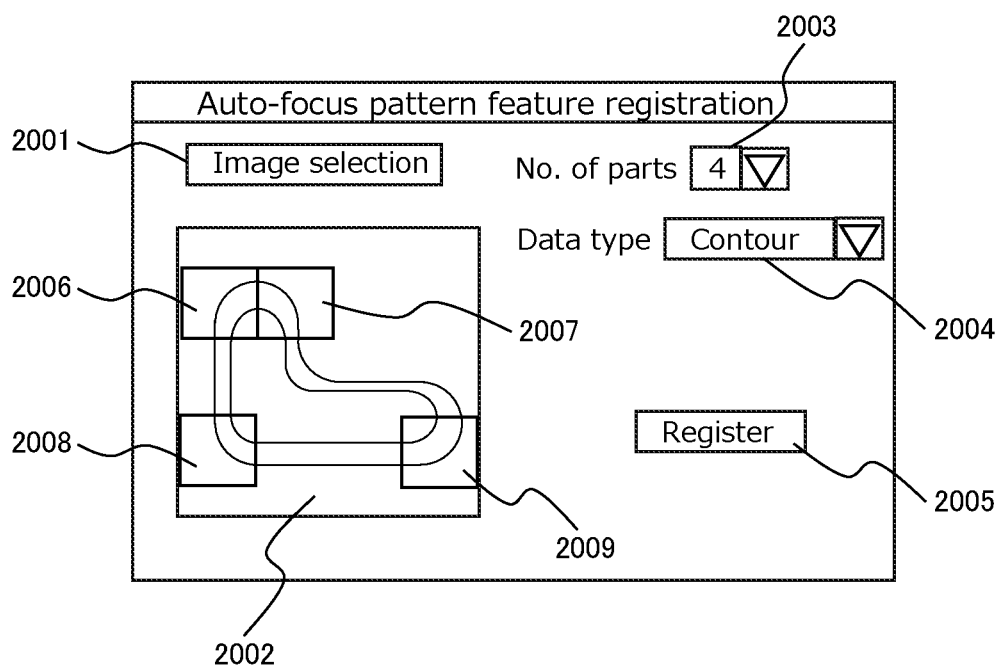
FIG. 20 is an example of a monitor screen.

The procedure of the inspection is the same as that of the first embodiment. According to the present embodiment, either a target pattern for auto-focusing is imaged in a state of minimizing various kinds of aberration and the defocus amount of the SEM, or an image of a target pattern for auto-focusing having been imaged beforehand is called up, and a region for executing auto-focus determination is defined. An example of the monitor screen in executing this definition is illustrated in FIG. 20.

By clicking a button 2001, image data to be referred to is called up. In the drawing, a target pattern image has been already selected and shown on a display area 2002. Also, the display example of the display area 2002 has been simplified, and fact is that the belt-like region surrounded by two closed curves within the display area 2002 is displayed brightly and other regions are displayed darkly. By a parts quantity selection area 2003, it is selected how many pieces of parts are to be used for determination out of the target patterns. Here, "4" has been selected. By a data type selection area 2004, whether determination is executed by an image or by a contour line is selected. Here, "contour line" has been selected.

By selecting "4" in the parts quantity selection area 2003, four rectangular shapes appear within the display area 2002. The size and position of them can be changed by operation of a mouse. The operator decides parts so as to be included in determination regions 2006 to 2009 within the display area 2002, and clicks a registration button 2005 to finish registration. Thus, image data included in the determination regions 2006 to 2009 are stored in the storage region within the calculation unit.

Figure 21:
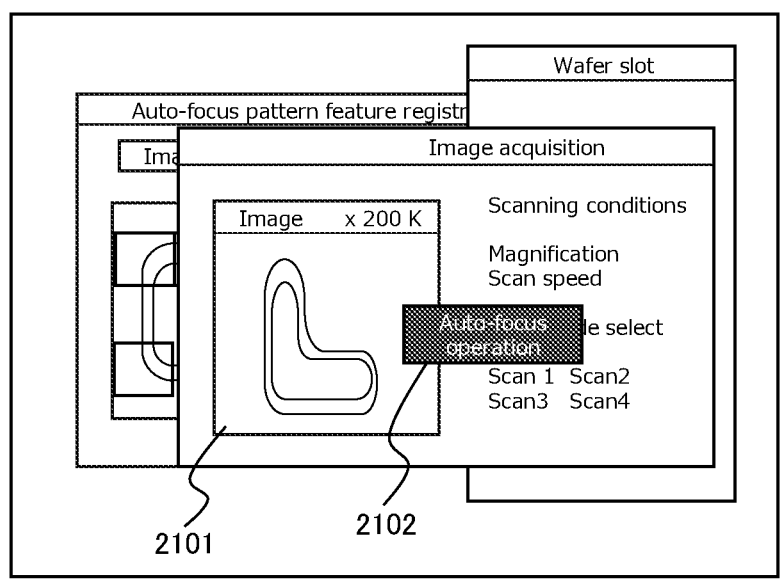
FIG. 21 is an example of a monitor screen.

With respect to auto-focusing, the flow of FIG. 11 is executed automatically by the calculation unit of the SEM. In FIG. 21, there is illustrated an example of the monitor screen of the SEM when an image is imaged introducing astigmatism in step 1102. In the background of an image 2101 of a distorted auto-focus pattern, a window for showing an inspection recipe, wafer information, and the like is displayed. An alarm 2102 is for notifying the operator of a fact that the image displayed at present is for auto-focusing, namely the image has been purposely distorted by adding astigmatism.

Figure 22:
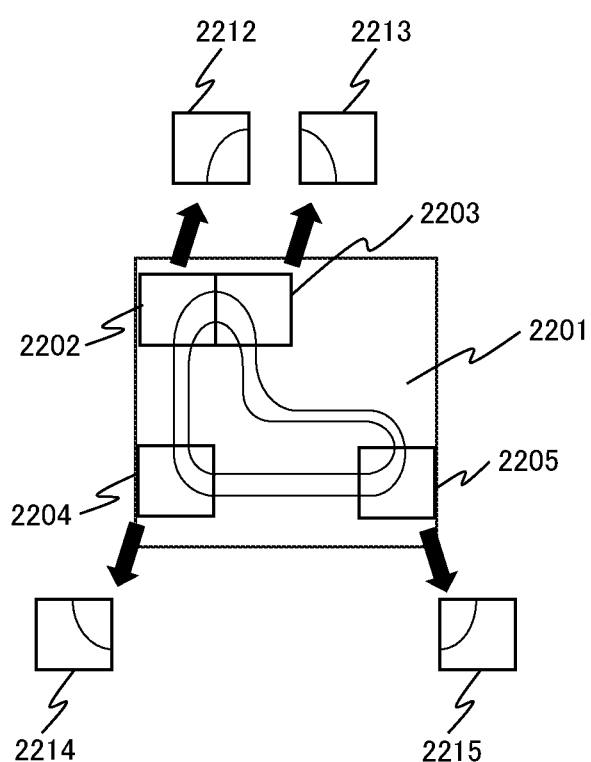
FIG. 22 is a drawing that explains an auto-focus determination method in the third embodiment.

In step 1103, a region corresponding to the region defined to be a region for executing auto-focus determination (a region defined by the determination regions 2006 to 2009 of FIG. 20) is searched from the image to which astigmatism has been introduced, and contour line images in respective regions are extracted. As illustrated in FIG. 22, with respect to a target pattern image 2201 obtained introducing astigmatism, determination regions 2202 to 2205 defined as regions for determination are extracted, and four line works (images) 2212 to 2215 of the contour line are obtained from them. Each of the images 2212 to 2215 is determined by the CNN.

Probability for each of the images 2212 to 2215 to have a certain defocus amount is obtained by determination by the CNN. For example, with respect to the image 2212, such result is obtained that probability the defocus amount is +480 nm is 0.3, probability the defocus amount is +460 nm is 0.5, and probability the defocus amount is +440 nm is 0.2. When a defocus amount maximizing the probability is assumed to be a most probable value, with respect to the image 2212, the defocus amount becomes +460 nm, and the error becomes 200 nm in terms of the dispersion value which is converted into the standard deviation of 14 nm. The same process is executed for the images 2213 to 2215 and four data pieces are averaged with the result that the defocus amount is +455 nm namely (z_best-z_0) is −455 nm, and the dispersion average is 240 nm which is converted into the standard deviation of 15 nm.

Whether (z_best-z_0) obtained thus is within the depth of focus is determined (step 1105), and whether the dispersion average or the standard deviation is within a range set as the reliability index value is determined (step 1107). It is preferable to image the target pattern again after finishing the auto-focus flow of FIG. 11, and to store the image in a recording device along with the image obtained in step 1102. The reason of doing so is for investigating possibility of the failure of auto-focusing when abnormality is seen in the inspection result. Thereafter, the inspection pattern is imaged.

Fourth Embodiment

According to a fourth embodiment, the inspection time is shortened by deciding the focusing condition of the image for inspection according to the sign of defocusing estimated from two sheets of the line pattern images and executing the inspection.

With respect to the method used in the fourth embodiment, in the table of FIG. 16, the pictorial figure is a line pattern in one direction (here, the line pattern is placed so that the longitudinal direction becomes the Y-direction on the screen), the imaging method is utilizing aberration, and the determination method is combination of the indexes.

Figure 23:
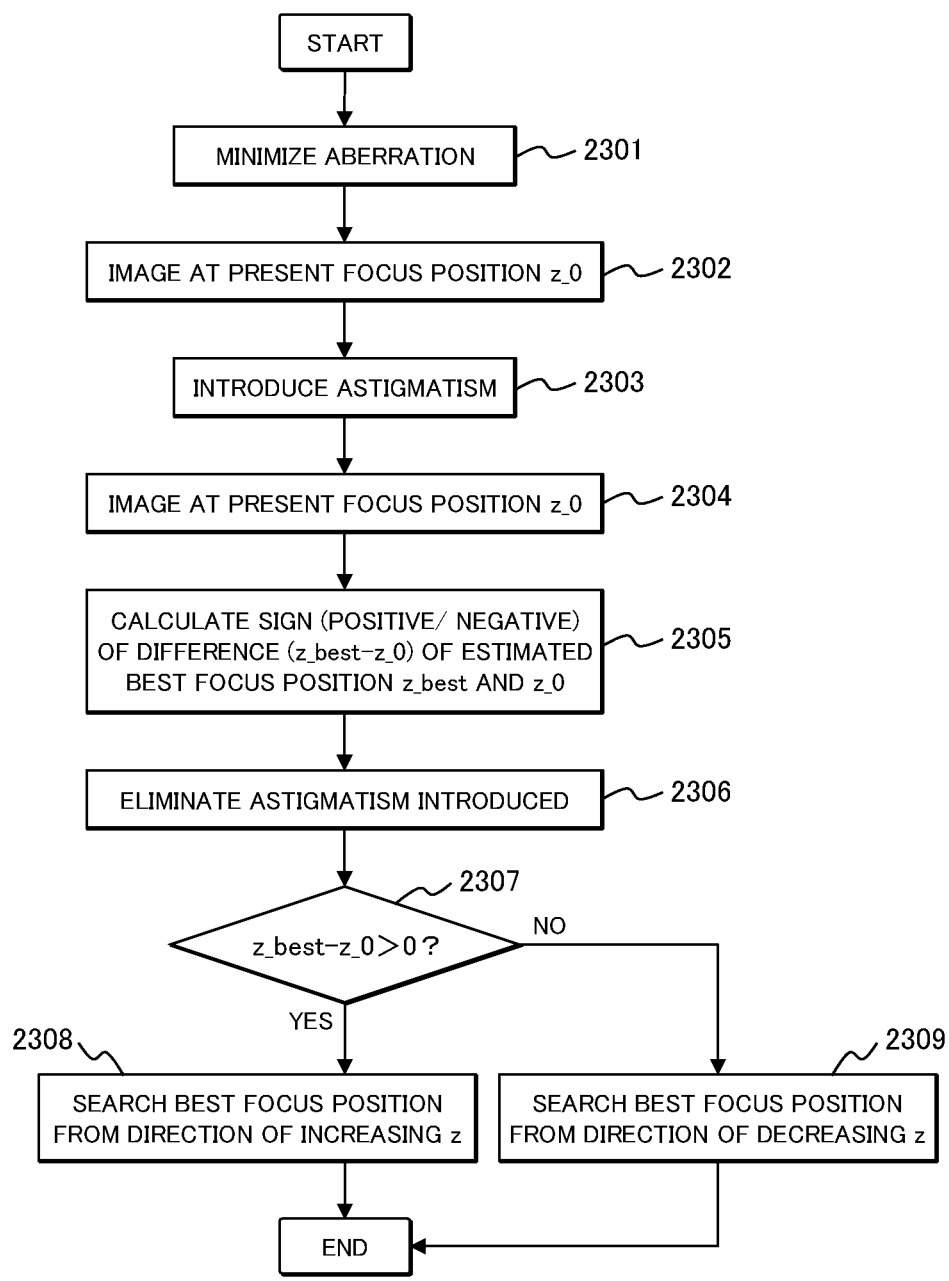
FIG. 23 is a flow of auto-focusing.

The procedure of the inspection is the same as that of the first embodiment. Auto-focusing is executed automatically by the calculation unit of the SEM. The flow of auto-focusing in the fourth embodiment will be illustrated in FIG. 23.

Figure 24:
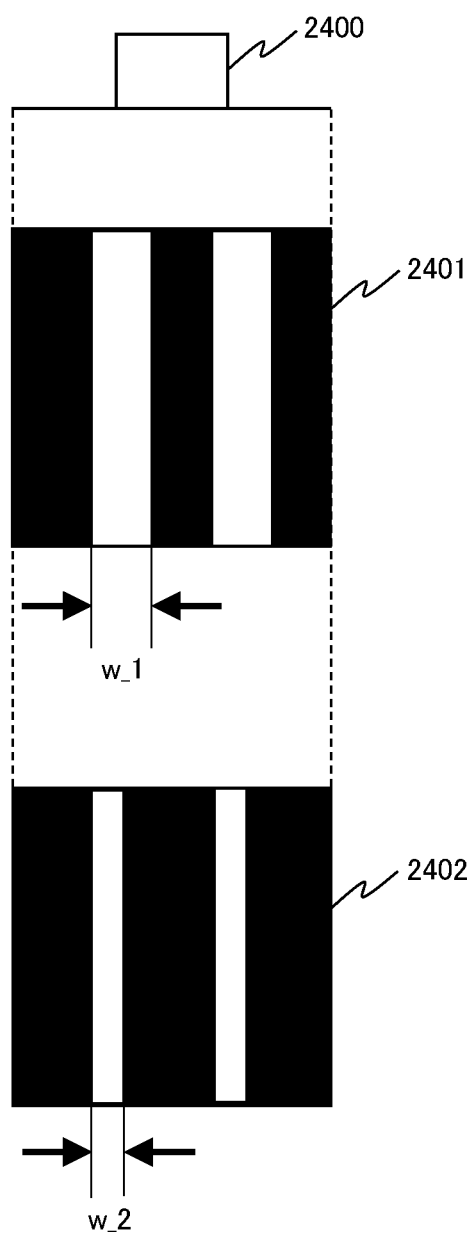
FIG. 24 is a schematic drawing of a pattern image of a line (space) pattern.

First, in step 2301, the SEM is set to a condition of minimizing various kinds of aberration having been registered on the storage device. Also, this setting is not required to be executed every time the spot is changed, and has only to be executed once in the beginning in inspecting one sheet of the wafer. The focus position may be either adjusted or not. In step 2302, imaging is executed in the state (at the focus position z_0). The result of it is made the first image. Next, in step 2303, the parameter of the optical system is changed so that astigmatism whose amount has been decided beforehand is added. Here, the condition is such that the focus position in the X-direction shifted upward on the paper surface by addition of astigmatism (refer to FIG. 15). In this case, the focus position of the Y-direction comes to be shifted to the opposite side. Imaging is executed in a state of introducing astigmatism (step 2304), and the result of it is made the second image. As shown in FIG. 24, with respect to a line pattern 2400, a first image 2401 and a second image 2402 are obtained. Although the images are shaded actually, the images are shown binarizing the brightness of pixels.

In step 2305, the sign of (z_best-z_0) is calculated from the first and second images. The procedure of the calculation will be explained referring to FIG. 15 and FIG. 24. First, from the first image 2401 and the second image 2402, the width of a bright belt-like region equivalent to the pattern edge is calculated. The belt like region width of the first image 2401 is made a width w_1, and the belt like region width of the second image 2402 is made a width w_2. These values correspond to the width of the arrow line 1503 and the width of the arrow line 1504 in FIG. 15 respectively. In this example, the magnification relation is width w_1 > width w_2, and it means that the focus position z_0 at the time of imaging is positioned below the position of the sample surface (=z_best) on the paper surface (refer to FIG. 15). Accordingly, it can be determined that (z_best-z_0) is positive. On the other hand, in the case of width w_1 < width w_2, it can be determined that (z_best-z_0) is negative. Also, when the characteristic of the astigmatism added is opposite, determinations of the result become opposite respectively.

Then, the astigmatism having been introduced is eliminated (step 2306). Next, the process branches according to the sign of (z_best-z_0) (step 2307). In the example of FIG. 24, since (z_best-z_0) is positive, the process proceeds to step 2308, imaging is executed while adjusting the parameter of the system so as to move the focus position upward, and the best focus position is searched while evaluating sharpness of the image. When searching of the best focus position is failed in step 2308, searching comes to be executed to the opposite side. However, since the case of failure is the case where the value of (z_best-z_0) is small, it is expected to be capable of finding the best focus position immediately even when searching is executed to both of the plus side and the minus side.

REFERENCE SIGNS LIST

400 . . . case, 401 . . . electron gun, 402 . . . electron beam, 403 . . . focus lens, 404 . . . astigmatism corrector, 405 . . . deflector, 406 . . . object lens, 407 . . . sample, 408 . . . stage, 409 . . . secondary electron, 410 . . . detector, 411 . . . control unit, 412 . . . calculation unit, 413 . . . storage device, 700, 800 . . . top view image of pattern, 701, 702, 801, 802 . . . region, 703, 803 . . . pattern image, 900 . . . top view image of pattern, 901, 902, 903, 904 . . . region, 905 . . . pattern image, 1401, 1402, 1501, 1502 . . . beam, 1403, 1503, 1504 . . . spread of beam, 1901, 1902, 1903, 1904 . . . line work, 2001 . . . button, 2002 . . . display area, 2003 . . . parts quantity selection area, 2004 . . . data type selection area, 2005 . . . registration button, 2006, 2007, 2008, 2009 . . . determination region, 2101 . . . auto-focus pattern image, 2102 . . . alarm, 2201 . . . target pattern image, 2202, 2203, 2204, 2205 . . . determination region, 2212, 2213, 2214, 2215 . . . line work, 2400 . . . line pattern, 2401, 2402 . . . image

What is claimed is:

1. An inspection device that observes patterns formed on a sample at a plurality of inspection spots, the inspection device comprising:
    a charged particle optical system that includes a charged particle beam source emitting a charged particle beam and a plurality of lenses focusing the charged particle beam on the sample;
    a detector that detects secondary charged particles emitted by an interaction of the charged particle beam and the sample; and
    a calculation unit that executes auto-focusing at a time a field of view of the charged particle optical system moves over the plurality of inspection spots,
    wherein the calculation unit irradiates the charged particle beam to the sample under an optical condition that is obtained by introducing astigmatism of a predetermined specification to an optical condition that is for observing the pattern by the charged particle optical system, and executes the auto-focusing using an image formed from a signal outputted by the detector in detecting the secondary charged particles,
    wherein the image includes a pattern image having a closed curve shape, and
    wherein the calculation unit calculates a position shift amount between a focus position of the charged particle beam of the time when the image is acquired and a best focus position based on distortion of the pattern image.

2. The inspection device according to claim 1, wherein the calculation unit does not adjust a focus position of the charged particle beam when the position shift amount is within a depth of focus of the inspection device, and adjusts the focus position of the charged particle beam so that the position shift amount is eliminated when the position shift amount exceeds the depth of focus of the inspection device.

3. The inspection device according to claim 2, wherein the calculation unit calculates an error included in the calculated position shift amount.

4. The inspection device according to claim 3,
    wherein the calculation unit searches the best focus position around a first focus position when the error exceeds a predetermined range,
    the first focus position is made a focus position of the charged particle beam of the time of acquiring the image when the position shift amount is within a depth of focus of the inspection device, and is made a focus position of the charged particle beam after adjustment so as to eliminate the position shift amount when the position shift amount exceeds the depth of focus of the inspection device, and
    searching of the best focus position is executed based on sharpness of a plurality of images acquired while changing a focus position of the charged particle beam under an optical condition of eliminating astigmatism of the predetermined specification.

5. The inspection device according to claim 1,
    wherein the calculation unit searches the best focus position to a direction of eliminating the position shift amount from a focus position of the charged particle beam of the time of acquiring the image according to positive/negative of the position shift amount, and
    searching of the best focus position is executed based on sharpness of a plurality of images acquired while changing a focus position of the charged particle beam under an optical condition of eliminating astigmatism of the predetermined specification.

6. The inspection device according to claim 1, further comprising a storage device that stores relation between magnitude of an index expressing distortion of the pattern image defined based on a contour line of the pattern image beforehand and the position shift amount,
wherein the calculation unit calculates the index of the acquired pattern image in the image, and obtains the calculated position shift amount from the index.

7. The inspection device according to claim 1, wherein the calculation unit obtains the position shift amount from the pattern image in the acquired image or from a contour line of the pattern image using an artificial intelligence.

8. The inspection device according to claim 7,
wherein the calculation unit obtains the position shift amount using a convolutional neural network having learnt,
the convolutional neural network executes learning using a dot pattern image or a hole pattern image having been acquired while changing a focus position of the charge particle beam under an optical condition obtained by introducing astigmatism having the predetermined specification to an optical condition that is for observing the pattern by the charged particle optical system, and
in obtaining the position shift amount, the calculation unit cuts out plural portions from the pattern image, connects the plural portions to each other, thereby works out a synthesized pattern image that corresponds to the dot pattern image or the hole pattern image on which learning has been executed, and allows the convolutional neural network to presume the position shift amount with respect to the synthesized pattern image.

9. The inspection device according to claim 7,
wherein the calculation unit obtains the position shift amount using a convolutional neural network having learnt,
the convolutional neural network executes learning using a split image of a dot pattern image or a split image of a hole pattern image having been acquired while changing a focus position of the charged particle beam under an optical condition obtained by introducing astigmatism having the predetermined specification to an optical condition that is for observing the pattern by the charged particle optical system, and
in obtaining the position shift amount, the calculation unit allows the convolutional neural network to presume the position shift amount with respect to partial pattern images cut out from the pattern image.

10. The inspection device according to claim 1, wherein the pattern image is an image of a pattern for auto-focusing formed on the sample, or an image of the pattern that is an observation object, or an image of a pattern having a closed curve shape positioned in the vicinity of the pattern.

11. An inspection device that observes patterns formed on a sample at a plurality of inspection spots, the inspection device comprising:
a charged particle optical system that includes a charged particle beam source emitting a charged particle beam and a plurality of lenses focusing the charged particle beam on the sample;
a detector that detects secondary charged particles emitted by an interaction of the charged particle beam and the sample; and
a calculation unit that executes auto-focusing at a time a field of view of the charged particle optical system moves over the plurality of inspection spots,
wherein the calculation unit irradiates the charged particle beam to the sample under an optical condition that is obtained by introducing astigmatism of a predetermined specification to an optical condition that is for observing the pattern by the charged particle optical system, and executes the auto-focusing using an image formed from a signal outputted by the detector in detecting the secondary charged particles,
wherein the image includes a first line pattern image or a first space pattern image and a second line pattern image or a second space pattern image, the first line pattern image or the first space pattern image extending in a first direction, and the second line pattern image or the second space pattern image extending in a second direction that is orthogonal to the first direction, and
the calculation unit determines a direction for eliminating a position shift between a focus position of the charged particle beam in acquiring the image and a best focus position based on a magnitude relation between a first blur of the first line pattern image or the first space pattern image and a second blur of the second line pattern image or the second space pattern image.

12. The inspection device according to claim 11, further comprising a monitor that displays an image formed from a signal outputted by the detector in detecting the secondary charged particles,
wherein the calculation unit displays the image acquired under an optical condition introducing astigmatism of the predetermined specification on the monitor along with an alarm showing that auto-focusing is in execution.

13. The inspection device according to claim 1, further comprising a monitor that displays an image formed from a signal outputted by the detector in detecting the secondary charged particles,
wherein the calculation unit displays the image acquired under an optical condition introducing astigmatism of the predetermined specification on the monitor along with an alarm showing that auto-focusing is in execution.

14. The inspection device according to claim 1,
wherein the charged particle beam optical system includes an astigmatism corrector, and
the calculation unit acquires the image that is for the auto-focusing under a condition of adding a control amount that is for introducing astigmatism of the predetermined specification to a control amount of the astigmatism corrector under an optical condition that is for observing the pattern by the charged particle beam optical system, and returns a control amount of the astigmatism corrector to the control amount under the optical condition that is for observing the pattern by the charged particle beam optical system after executing the auto-focusing.

15. The inspection device according to claim 11,
wherein the charged particle beam optical system includes an astigmatism corrector, and
the calculation unit acquires the image that is for the auto-focusing under a condition of adding a control amount that is for introducing astigmatism of the predetermined specification to a control amount of the astigmatism corrector under an optical condition that is for observing the pattern by the charged particle beam optical system, and returns a control amount of the astigmatism corrector to the control amount under the optical condition that is for observing the pattern by the charged particle beam optical system after executing the auto-focusing.

* * * * *